(12) United States Patent
Kosuga et al.

(10) Patent No.: US 9,750,147 B2
(45) Date of Patent: Aug. 29, 2017

(54) POWER CONVERTER

(71) Applicant: Hitachi Automotive Systems, Ltd., Hitachinaka-shi, Ibaraki (JP)

(72) Inventors: Masashi Kosuga, Hitachinaka (JP); Hideyo Suzuki, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/775,124

(22) PCT Filed: Dec. 18, 2013

(86) PCT No.: PCT/JP2013/083813
§ 371 (c)(1),
(2) Date: Sep. 11, 2015

(87) PCT Pub. No.: WO2014/141558
PCT Pub. Date: Sep. 18, 2014

(65) Prior Publication Data
US 2016/0037654 A1 Feb. 4, 2016

(30) Foreign Application Priority Data

Mar. 13, 2013 (JP) ................................ 2013-049831

(51) Int. Cl.
*H02M 7/42* (2006.01)
*H05K 5/00* (2006.01)
(Continued)

(52) U.S. Cl.
CPC ............ *H05K 5/006* (2013.01); *H02M 7/003* (2013.01); *H02M 7/537* (2013.01); *H05K 5/0017* (2013.01); *H05K 7/1432* (2013.01)

(58) Field of Classification Search
CPC ........ H02M 7/003; H02M 7/42; H02M 7/537; H02M 7/5387; H05K 7/02; H01B 17/18
See application file for complete search history.

(56) References Cited

U.S. PATENT DOCUMENTS

| 5,623,399 A | * | 4/1997 | Ishii | ...................... H02M 7/003 363/132 |
| 5,872,711 A | * | 2/1999 | Janko | ...................... F28F 13/00 174/72 B |

(Continued)

FOREIGN PATENT DOCUMENTS

| JP | 11-89246 A | 3/1999 |
| JP | 2007-234561 A | 9/2007 |

(Continued)

OTHER PUBLICATIONS

International Search Report (PCT/ISA/210) dated Apr. 8, 2014, with English translation (four (4) pages).

*Primary Examiner* — Gary L Laxton
(74) *Attorney, Agent, or Firm* — Crowell & Moring LLP

(57) ABSTRACT

A power converter is provided to improve connection reliability of internal components of the power converter. The power converter may include a power semiconductor module that converts DC current into AC current, a casing that forms a housing space for housing the power semiconductor module, an AC relay bus bar that is connected to an AC terminal of the power semiconductor module by weld connection, and an AC terminal block that is connected to an AC terminal of a motor. The AC relay bus bar may be supported by the casing through an insulating member, and the AC terminal block may be connected to the AC relay bus bar and supported by the casing.

6 Claims, 21 Drawing Sheets

(51) Int. Cl.
*H02M 7/00* (2006.01)
*H02M 7/537* (2006.01)
*H05K 7/14* (2006.01)
H05K 7/02 (2006.01)
H01B 17/18 (2006.01)

(56) References Cited

U.S. PATENT DOCUMENTS

| | | | | |
|---|---|---|---|---|
| 6,867,970 | B2* | 3/2005 | Muller | H05K 7/20909 |
| | | | | 165/104.33 |
| 7,187,568 | B2* | 3/2007 | Radosevich | H02M 1/44 |
| | | | | 361/699 |
| 7,505,294 | B2* | 3/2009 | Ahmed | H02M 7/003 |
| | | | | 363/132 |
| 8,902,612 | B2* | 12/2014 | Inuduka | H02M 7/003 |
| | | | | 361/328 |
| 2007/0096278 | A1* | 5/2007 | Nakatsu | H01L 23/3675 |
| | | | | 257/678 |
| 2007/0207652 | A1 | 9/2007 | Tsuruta | |
| 2011/0249421 | A1* | 10/2011 | Matsuo | B60L 7/14 |
| | | | | 361/821 |
| 2012/0300521 | A1 | 11/2012 | Hida et al. | |
| 2013/0279114 | A1 | 10/2013 | Nishikimi et al. | |
| 2014/0160822 | A1 | 6/2014 | Kuwano et al. | |

FOREIGN PATENT DOCUMENTS

| | | |
|---|---|---|
| JP | 2011-134813 A | 7/2011 |
| JP | 2011-135737 A | 7/2011 |
| JP | 2011-172401 A | 9/2011 |
| JP | 2012-139014 A | 7/2012 |
| JP | 2013-9581 A | 1/2013 |
| JP | 2013-27218 A | 2/2013 |

* cited by examiner

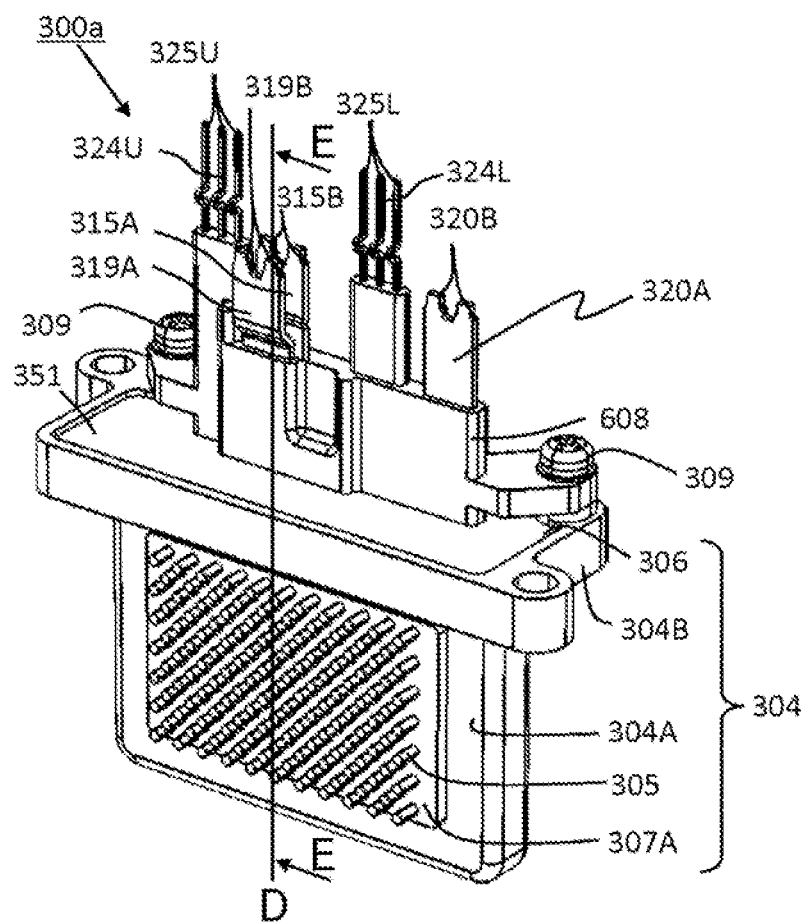

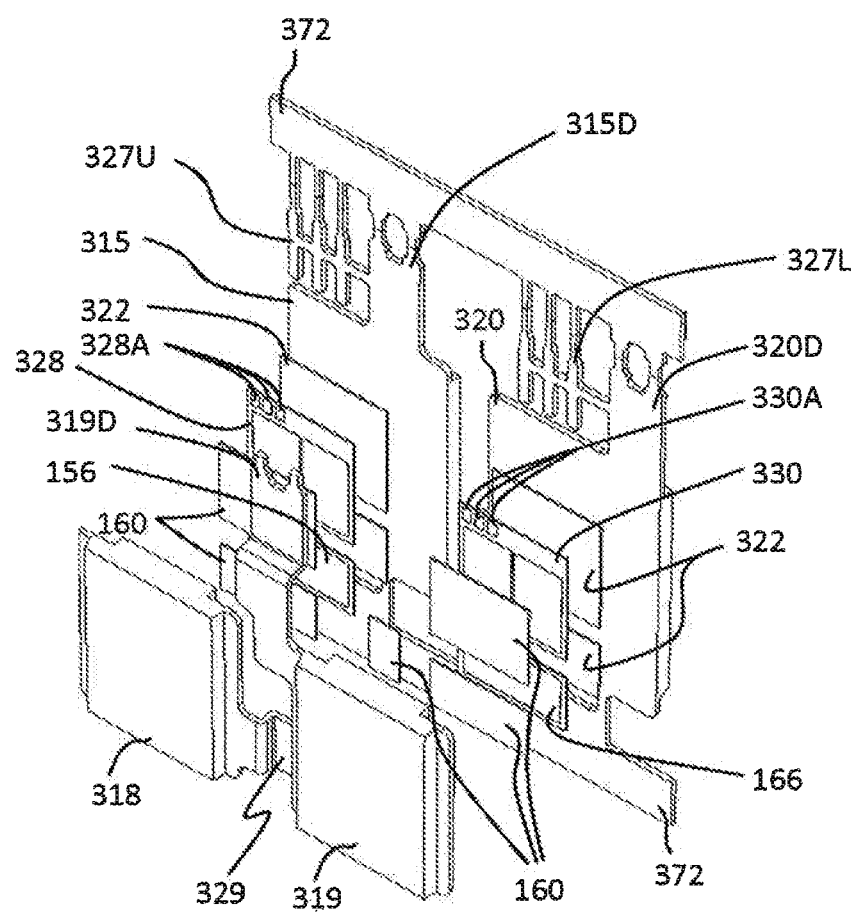

POWER CONVERTER

TECHNICAL FIELD

The present invention relates to a power converter that is used for converting DC power into AC power or converting AC power into DC power and, particularly, to a power converter that is used in a hybrid vehicle or an electric vehicle.

BACKGROUND ART

In general, a power converter includes an inverter circuit that generates AC power by receiving DC power and a control circuit for controlling the inverter circuit. In recent years, downsizing of the power converter has been demanded. Particularly, in the field of hybrid vehicles and electric vehicles, it is desired that the power converter is mounted outside a cabin, especially, in an engine room, occupying as small space as possible and in order to improve mountability on a vehicle, further downsizing is required.

Furthermore, there is a tendency that an operation time or an operation condition (high output torque condition) of a motor used as a driving source is extended and improvement of the reliability of the power converter is also demanded simultaneously.

An example for improving the reliability of the power converter, especially, a welding section is disclosed in PTL 1 (JP-A-2011-134813) and PTL 2 (JP-A-2011-172401).

However, the vibration conduction of the power converter mounted on the vehicle is severe and further improvement of the connection reliability of the internal components of the power converter is required.

CITATION LIST

Patent Literature

PTL 1: JP-A-2011-134813
PTL 2: JP-A-2011-17240

SUMMARY OF INVENTION

Technical Problem

An object of the invention is to further improve the connection reliability of the internal components of a power converter.

Solution to Problem

According to the present invention, there is provided a power converter including: a power semiconductor module that converts DC current into AC current; a casing that forms a housing space for housing the power semiconductor module; an AC relay bus bar that is connected to an AC terminal of the power semiconductor module by weld connection; and an AC terminal block that is connected to an AC terminal of a motor, wherein the AC relay bus bar is supported by the casing through an insulating member, and the AC terminal block is connected to the AC relay bus bar and supported by the casing.

Advantageous Effects of Invention

According to the invention, it is possible to further improve the connection reliability of the internal components of the power converter.

BRIEF DESCRIPTION OF DRAWINGS

FIG. 4A is a perspective view illustrating an external appearance of a power semiconductor module 300a.

FIG. 4B is a sectional view of the power semiconductor module 300a.

FIG. 5A is a perspective view illustrating the external appearance of the power semiconductor module 300a.

FIG. 8 is a view describing an assembly process of a module primary sealing body 302.

DESCRIPTION OF EMBODIMENTS

Next, embodiments of the invention will be described with reference to the drawings. A power converter 200 according to the embodiment is used mainly in a hybrid electric vehicle or an electric vehicle. An example of a vehicle system is described in JP-A-2011-217550. Moreover, the power converter 100 of the embodiment may be used in another usage to achieve effects thereof. For example, the power converter 200 may be used in an inverter of a household refrigerator or air conditioner for the purpose of improving productivity or cool lug performance. Furthermore, the power converter 200 may be used in an inverter for an industrial apparatus of which the usage environment is similar to that of a inverter for the vehicle.

Figure 1:
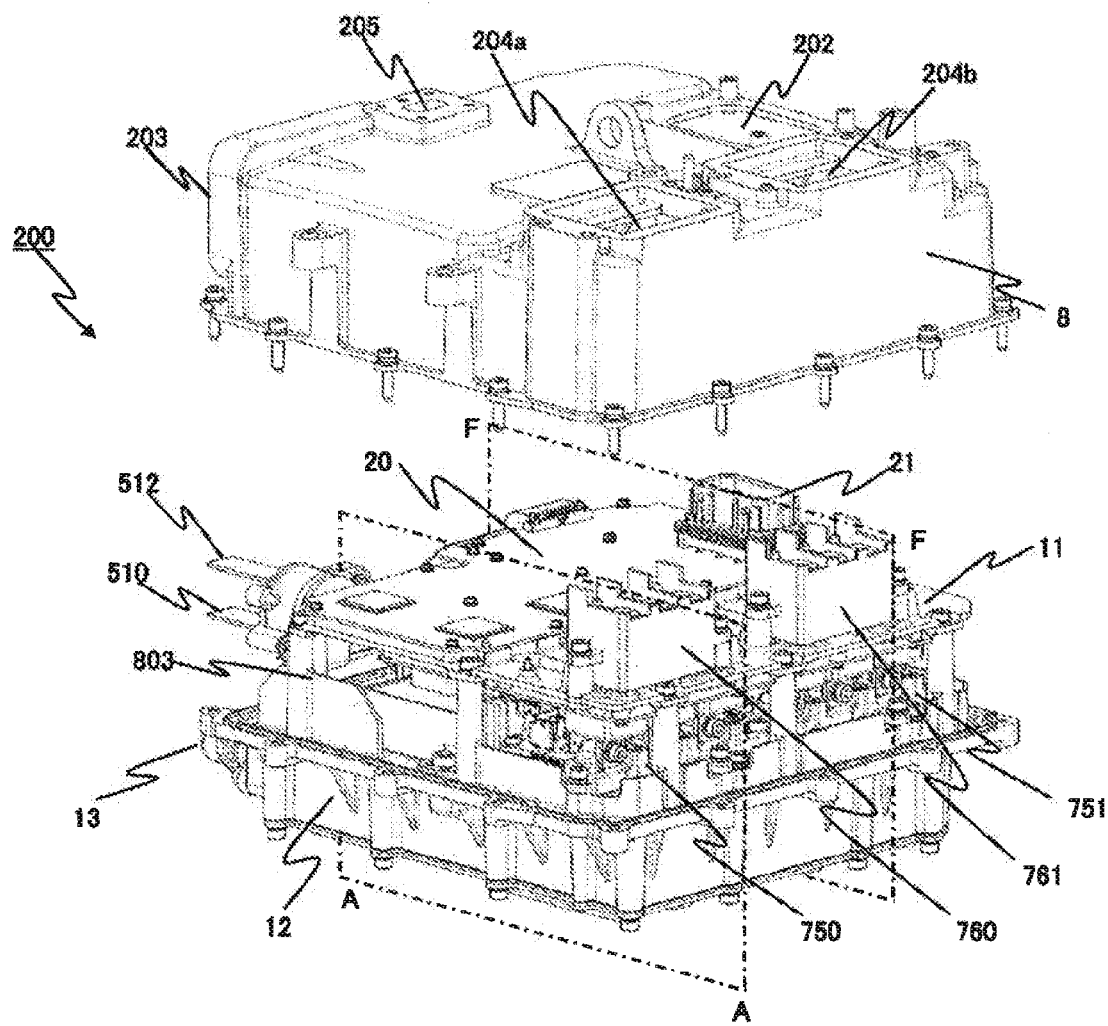
FIG. 1 is an exploded perspective view for describing a configuration of a power converter.
Figure 2:
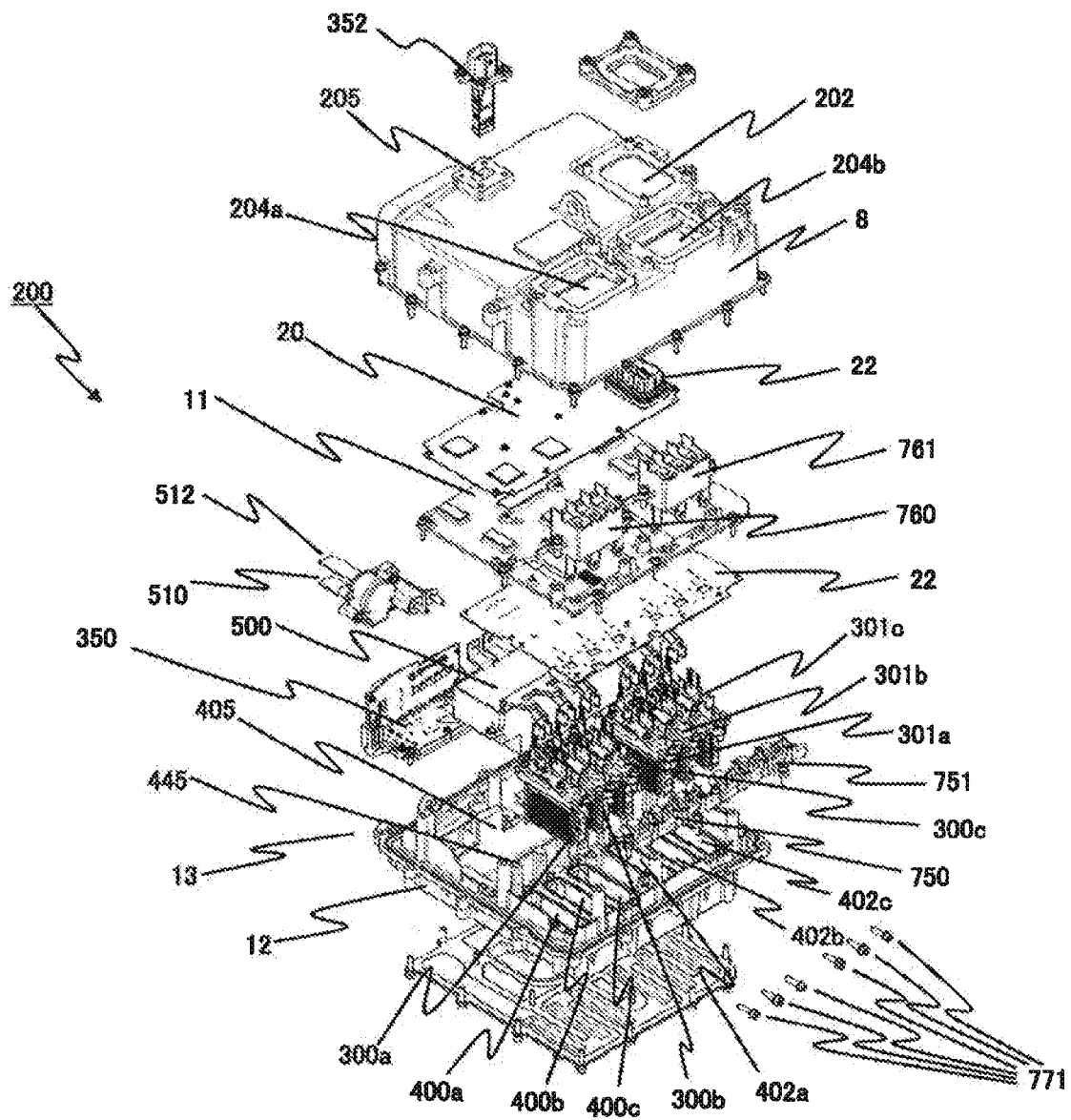
FIG. 2 is a perspective view of the power converter in which the entire configuration of the power converter is disassembled into configuration elements for describing the configuration.

FIG. 1 is an exploded perspective view of the power converter 200 as the embodiment of the invention. FIG. 2 is an overall perspective view of the power converter 200 in which configurations housed on an inside of a flow path forming body 12 of the power converter 200 are disassembled to facilitate understanding thereof.

The power converter 200 has the flow path forming body 12 that functions as a case housing power semiconductor modules 300a to 300c power semiconductor modules 301a to 301c, and a capacitor module 500 to be described below and forms a flow path, and a lid 8. Moreover, a case is provided separately from the flow path forming body 12 of the embodiment and the flow path forming body 12 may be housed in the case.

The lid 8 houses circuit components configuring the power converter 200 and is fixed to the flow path forming body 12. A control circuit substrate 20 on which a control circuit is mounted is disposed in an upper portion on an inside of the lid 8. An upper surface of the lid 8 is provided with a first opening 202, a third opening 204a, a fourth opening 204b, and a fifth opening 205. Furthermore, a side wall of the lid 8 is provided with a second opening 203.

A connector 21 is provided in the control circuit substrate 20 and protrudes to the outside through the first opening 202. A negative electrode-side power line 510 and a positive electrode-side power line 512 are electrically connected to a DC connector 138, the capacitor module 500, and the like, and protrude to the outside through the third opening 203.

An AC terminal block 760 is connected to the power semiconductor modules 300a to 300c through an AC relay bus bar 750 and protrudes to the outside through the third opening 204a. An AC terminal block 761 is connected to the power semiconductor modules 301a to 301c through an AC relay bus bar 751 and protrudes to the outside through the fourth opening 204b. An AC output terminal 352 of an auxiliary machine power module 350 protrudes to the outside through the fifth opening 205.

The orientation of a fitting surface of terminals of the connector 21 and the like becomes various directions according to the type of vehicle and, particularly, if the power converter 200 is mounted on a small-sized vehicle, it is preferable that the connector 21 and the like are disposed of which the fitting surface is oriented upward in terms of size constraints in an engine room or assemblability. For example, if the power converter 200 is disposed above a transmission TM, the power converter 200 protrudes toward a side opposite to the side in which the transmission TM is disposed and thereby workability is improved.

Moreover, the lid 8 is made of metal and functions as a case housing the power semiconductor modules 300a to 300c and 301a to 301c, a driver circuit substrate 22, the control circuit substrate 20, and a metal base plate 11.

Furthermore, the connector 21 protrudes to the outside of the lid 8 from a housing space of the lid 8 through the first opening 202. Thus, since the control circuit substrate 20 on which the connector 21 is mounted is attached on the base plate 11, even if a physical force is applied to the connector 21 from the outside, a load to the control circuit substrate 20 is suppressed. Thus, improvement of reliability including durability is expected.

The flow path forming body 12 forms opening sections 400a to 400c and opening sections 402a to 402c connected to a flow path through which cooling refrigerant flows. The opening sections 400a to 400c are closed by the inserted power semiconductor modules 300a to 300c and opening sections 402d to 402f are closed by the inserted power semiconductor modules 301a to 301c.

The flow path forming body 12 is configured such that a housing space 405 for housing the capacitor module 500 is formed in a side portion of the space in which the bower semiconductor modules 300a to 300c and the power semiconductor modules 301a to 301c are housed.

Since distances between the power semiconductor modules 300a to 300c and the power semiconductor modules 301a to 301care substantially constant, the capacitor module 500 is easily balanced in each phase in which a circuit constant of a smoothing capacitor and a power semiconductor module circuit is a three-phase and becomes a circuit configuration in which a spike in voltage is easily reduced.

A main structure of the flow path of the flow path forming body 12 is made of aluminum material integrally with the flow path forming body 12 by casting and thereby the flow path can be made stronger in mechanical strength in addition to a cooling effect. Furthermore, the flow path forming body 12 and the flow path become an integral structure, the thermal conductivity is good, and the cooling efficiency is improved by being made of aluminum casting. Moreover, the flow path is completed by fixing the power semiconductor modules 300a to 300c and the power semiconductor modules 301a to 301c to the flow path and a water leak test of a waterway is performed. If the water leak test is passed, next, it is possible to perform work for attaching the capacitor module 500, the auxiliary machine power module 350, or a substrate. As described above, work for disposing the flow path forming body 12 in a bottom portion of the power converter 200, next, fixing necessary components such as the capacitor module 500, the auxiliary machine power module 350, and the substrate is performed in order from above, and thus productivity and reliability are improved.

The driver circuit substrate 22 is disposed above the power semiconductor modules 300a to 300c and the power semiconductor modules 301a to 301c, or the capacitor module 500. Furthermore, the base plate la is disposed between the driver circuit substrate 22 and the control circuit substrate. 20. The metal base plate 11 performs a function of electromagnetically shielding a circuit group mounted on the driver circuit substrate 22 and the control circuit substrate 20, and, has a cooling effect allowing heat generated by the driver circuit substrate 22 and the control circuit substrate 20 to escape.

Furthermore, the metal base plate 11 performs an operation to increase the mechanical resonance frequency of the control circuit substrate 20. That is, it is possible to arrange screwing portions for fixing the control circuit substrate 20 to the base plate 11 at short distances, to decrease the distance between supporting points if mechanical vibration occurs, and to increase the resonance frequency. For example, since the resonance frequency of the control circuit substrate 20 can be increased with respect to a vibration frequency transmitted from the transmission, influence of the vibration is unlikely to be received and reliability is improved.

Figure 3:
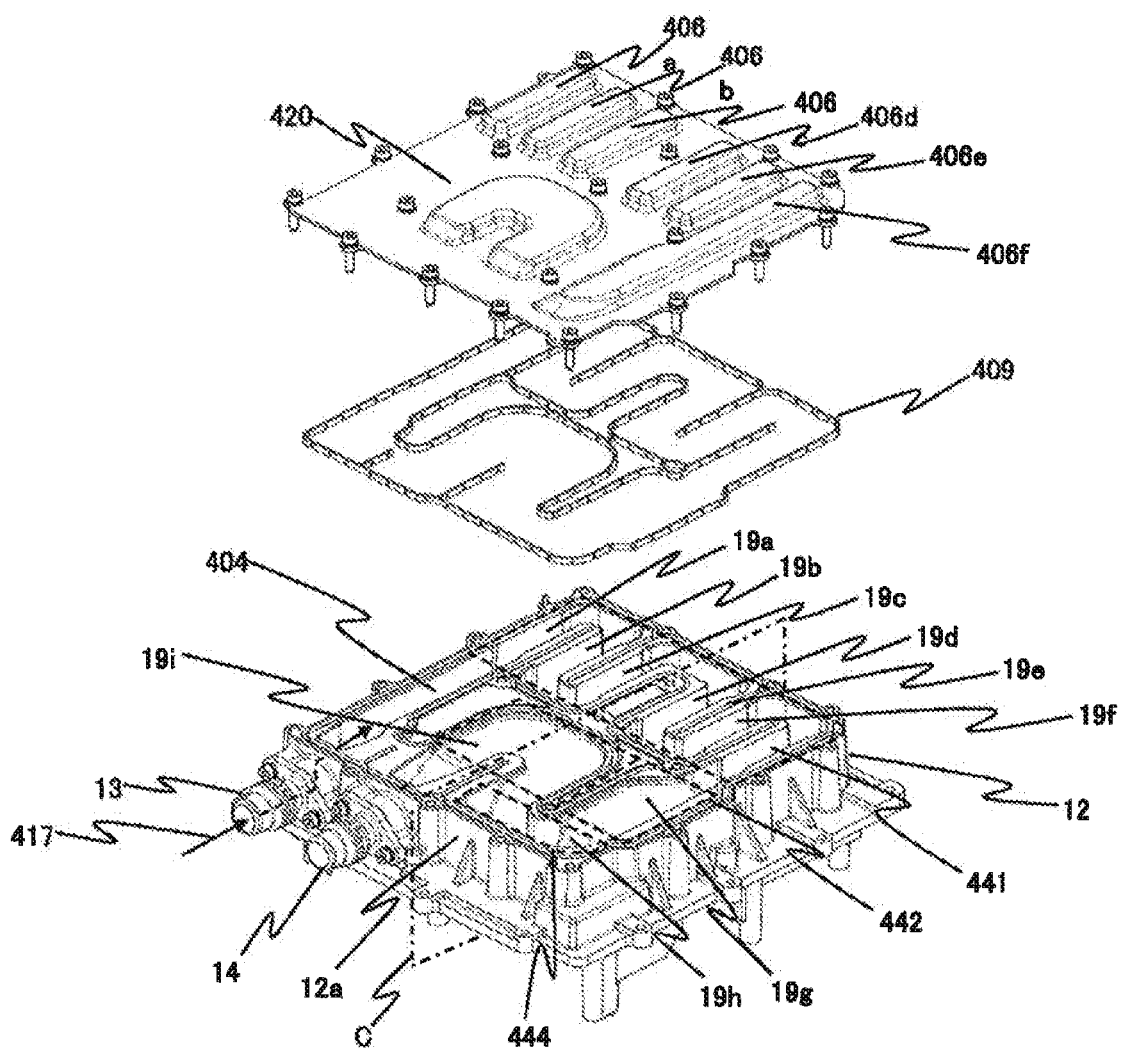
FIG. 3 is a view of a flow path forming body 12 illustrated in FIG. 4 viewed from below for describing the flow path forming body 12.

FIG. 3 is an explanatory view describing the flow path forming body 12 and a view of the flow path forming body 12 viewed from below illustrated in FIG. 2.

The flow path forming body 12 is provided with an inlet pipe 13 and an outlet pine 14 in one sidewall 12a. The cooling refrigerant flows in a direction of a flow direction 417 indicated by a dotted line and flows through a first flow path section 19a that is formed along one side of the flow path forming body 12 through the inlet pipe 13. A second flow path section 19b is connected to the first flow path section 19a through a folded flow path section and is formed parallel to the first flow path section 19a. A third flow path section 19c is connected to the second flow path section 19b through a folded flow path section and is formed parallel to the second flow path section 19b. A fourth flow path section 19d is connected to the third flow path section 19c through a folded flow path section and is formed parallel to the third flow path section 19c. A fifth flow path section 19e is connected to the fourth flow path section 19d through a folded flow path section and is formed parallel to the fourth flow path section 19d. A sixth flow path section 19f is connected to the fifth flow path section 19e through a folded flow path section and is formed parallel to the fifth flow path section 19e. That is the first flow path section 19a to the sixth flow path section 19f form a meandering flow path connected as one.

A first flow path forming body 441 forms the first flow path section 19a, the second flow path section 19b, the third flow path section 19c, the fourth flow path section 19d, the fifth flow path section 19e, and the sixth flow path section 19f. All the first flow path section 19a, the second flow path section 19b, the third flow path section 19c, the fourth flow path section 19d, the fifth flow path section 19e and the sixth flow path section 19f are formed such that sizes in depth directions are larger than those in width directions.

A seventh flow bath section 19g is connected to the sixth flow path section 19f and is formed in a position facing the housing space 405 of the capacitor module 500 illustrated in FIG. 4. A second flow path forming body 442 forms the seventh flow path section 19g and a ninth flow path section 19i described below. The seventh flow path section 19g is formed such that a size in the width direction is larger than that in the depth direction.

An eighth flow path section 19h is connected to the seventh flow path section 19g and is formed in a position facing the auxiliary machine power module 350 described below.

Furthermore, the eighth flow path section. 19h is connected to the ninth flow path section 19i. A third flow path forming body 444 forms the eighth flow path section. 19b. The eighth flow path section 19h is formed such that a size in the depth direction is larger than that in the width direction. Similar to the seventh flow path section 19g, the ninth flow path section 19i is formed in the position facing the housing space 405 of the capacitor module 500. Furthermore, the ninth flow path section 19i is connected to the outlet pipe 14.

An opening section. 404 that is connected to one is formed on a lower surface of the flow path forming body 12. The opening section 404 is closed by a lower cover 420. A sealing member 409 is provided between the lower cover 420 and the flow path forming body 12, and maintains airtightness.

Furthermore, the lower cover 420 is provided with convex sections 406a to 406f protruding in a direction away from the flow path forming body 12. The convex sections 406a to 406f are provided corresponding to the power semiconductor modules 300a to 300c and the power semiconductor modules 301a to 301c. That is, the convex section 406a is formed facing the first flow path section 19a. The convex section 406b is formed facing the second flow path section 19b. The convex section 406c is formed facing the third flow path section 19c. The convex section 406d is formed facing the fourth flow path section 19d. The convex section 406e is formed facing the fifth flow path section 19e. The convex section 406f is formed facing the sixth flow path section 19f.

The depth and width of the seventh flow path section 19g are changed to be greater than a depth and a width of the sixth flow path section 19f. Furthermore, a depth and a width of the ninth flow path section 19i are changed greater than a depth and a width of the eighth flow path section 19h, it is preferable that the second flow path forming body 442 is provided with straight fins (not illustrated) protruding to the seventh flow path section 19g and the ninth flow path section 19i such that it is possible to manage rectification and a flow rate of the cooling refrigerant by changing the shape of a large flow path.

Similarly, a depth and a width of the eighth flow path section 19h are changed greater than a depth and a width of the seventh flow path section 19g. It is preferable that the third flow path forming body 444 is provided with straight fins (not illustrated) protruding to the eighth flow path section 19h such that it is possible to manage the rectification and the flow rate of the cooling refrigerant by changing the shape of the large flow path. However, if there is no problem in the management of the rectification and the flow rate of the cooling refrigerant, it is not limited to the embodiment.

Detailed configurations of the power semiconductor modules 300a to 300c and the bower semiconductor modules 301a to 301c used in the inverter circuit will be described with reference to FIGS. 4 to 8. An the power semiconductor modules 300a to 300c and the power semiconductor modules 301a to 301c have the same structure, and as a representative, the structure of the power semiconductor module 300a is described.

Figure 4B:
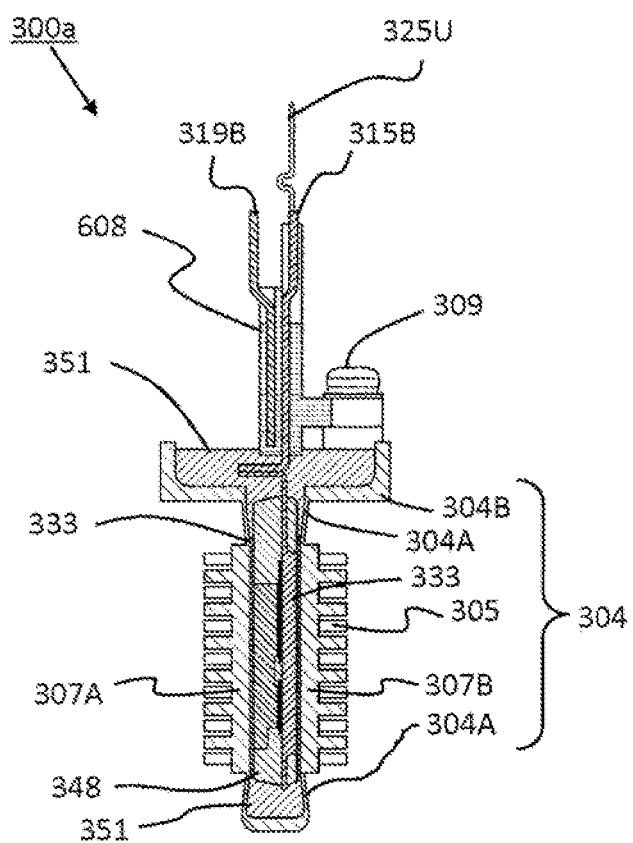

FIG. 4(a) is a perspective view of the power semiconductor module 300a of the embodiment. FIG. 4(b) is a sectional view of the power semiconductor module 300a of the embodiment that is cut in a cross section P when viewed from a direction E.

Figure 5A:
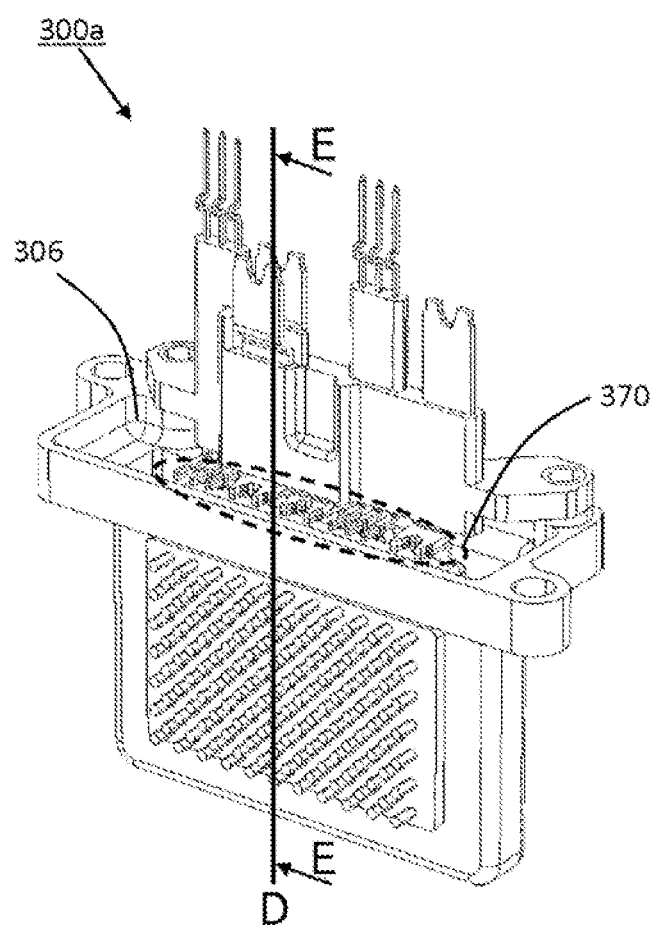
Figure 5B:
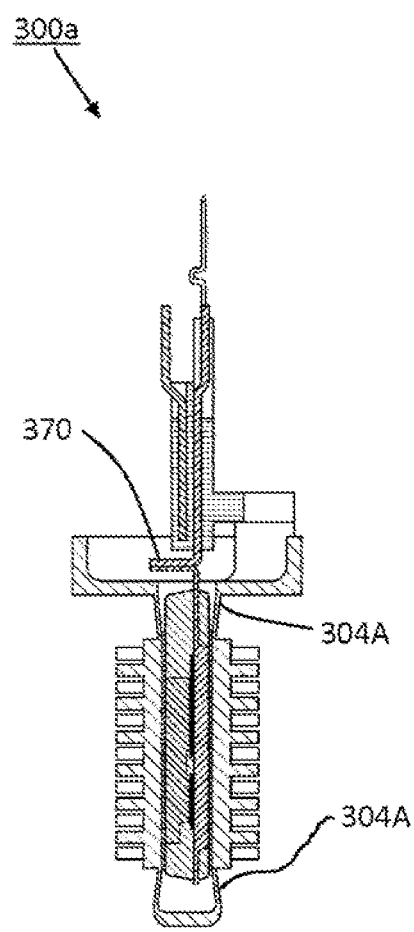
FIG. 5B is a sectional view that is cut in a cross section D similar to FIG. 4(b) when viewed from a direction E.
Figure 5C:
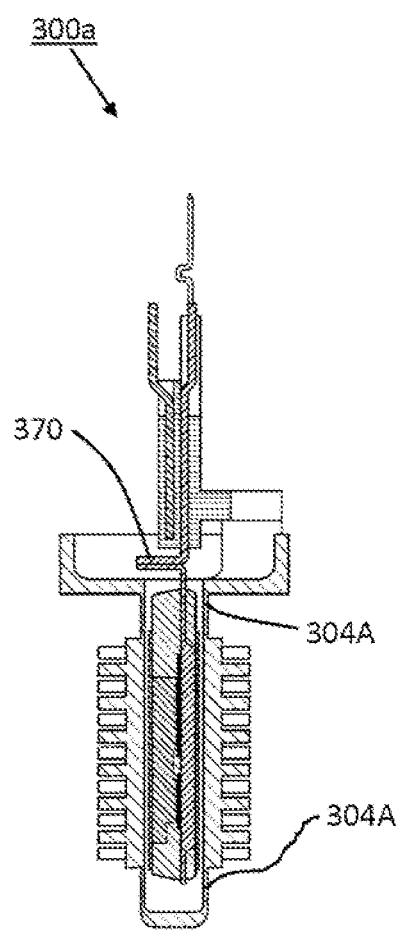
FIG. 5C illustrates a sectional view before fins 305 are pressed and a thin section 304A is deformed.

FIG. 5 is a view illustrating the power semiconductor module 300a in which screws 309 and a second sealing resin 351 are removed from a state illustrated in FIG. 4 to facilitate understanding. FIG. 5(a) is a perspective view and FIG. 5(b) is a sectional view that is cut in a cross section D when viewed from a direction F similar to FIG. 4(b). Furthermore, FIG. 5(c) illustrates a sectional view before fins 305 are pressed and a thin section 304A is deformed.

Figure 6A:
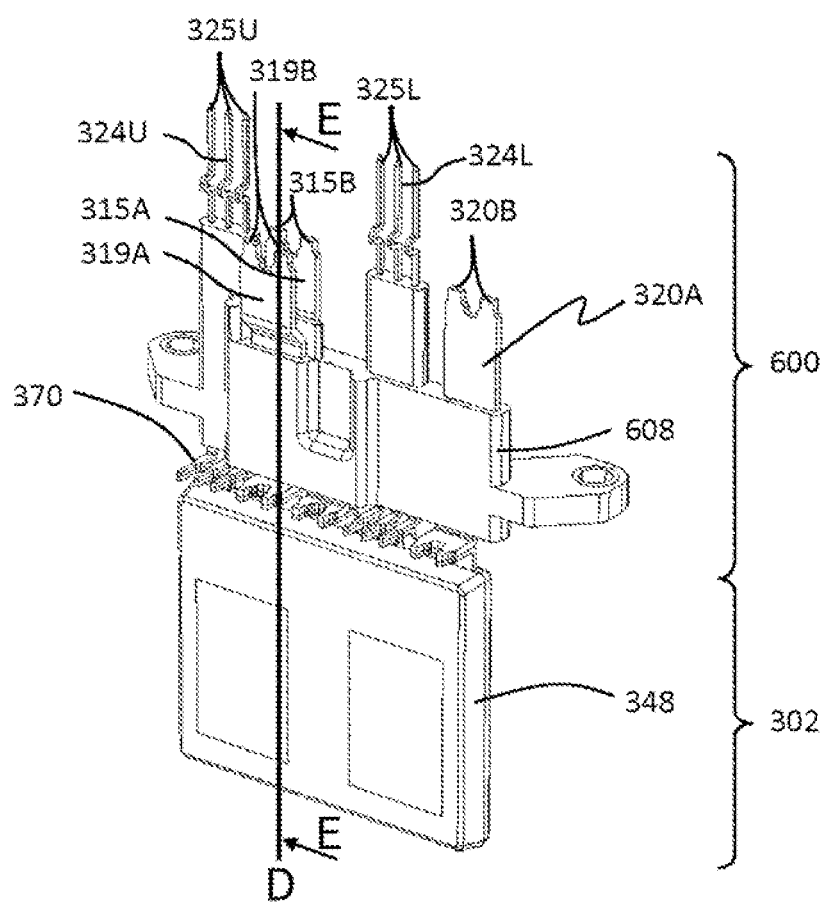
FIG. 6A is a perspective view illustrating the power semiconductor module 300a in which a module case 304 is further removed from a state illustrated in FIG. 5(a).
Figure 6B:
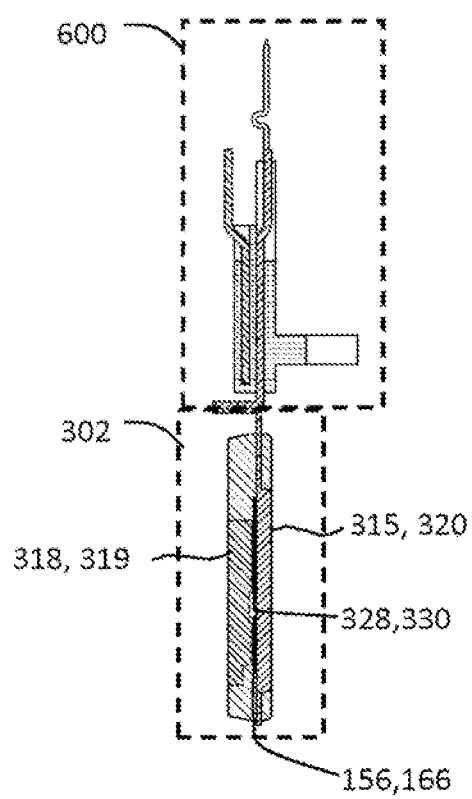
FIG. 6B is a sectional view that is cut in a cross section D similar to FIG. 4(b) and FIG. 5(b) when viewed from a direction E.

FIG. 6 is a view illustrating the power semiconductor module 300a in which a module case 304 is further removed from a state illustrated in FIG. 5. FIG. 6(a) is a perspective view, and FIG. 6(b) is a sectional view that is cut in a cross section D when viewed from a direction E similar to FIGS. 4(b) and 5(b).

Figure 7:
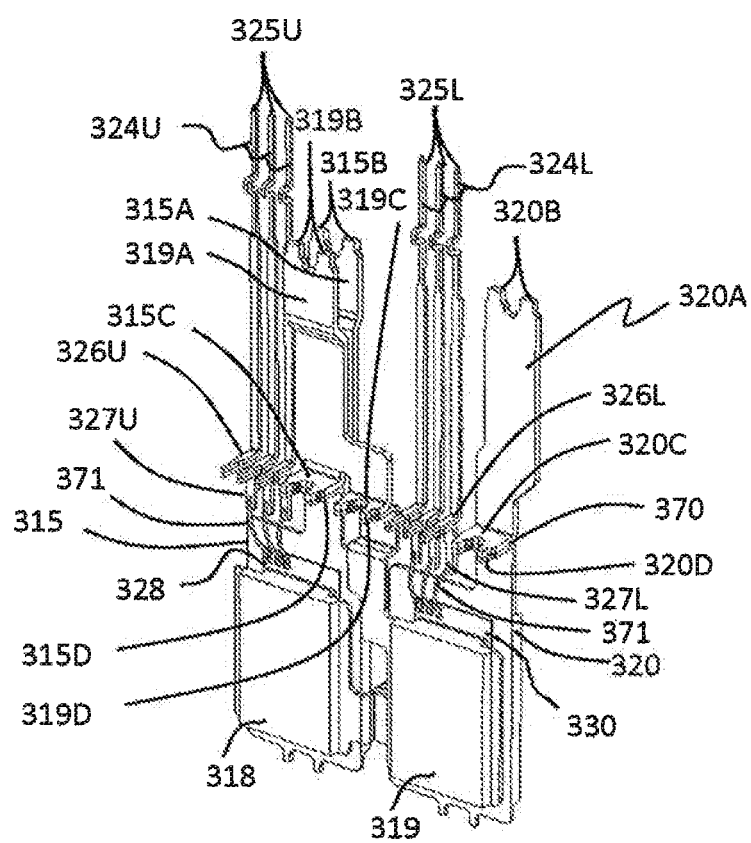
FIG. 7 is a perspective view illustrating the power semiconductor module 300a in which a first sealing resin 348 and a wiring insulating section 608 are further removed from a state illustrated in FIG. 6(a).

FIG. 7 is a perspective view of the power semiconductor module 300a in which a first sealing resin 348 and a wiring insulating section 608 are further removed from a state illustrated in FIG. 6. FIG. 8 is a view describing the assembly process of a module primary sealing body 302.

As illustrated in FIGS. 6 and 7, a power semiconductor device (IGBT 328, IGBT 330, diode 156, and diode 166) configuring a series circuit of upper and lower arms is fixed by being sandwiched from both sides by a conductive plate 315 or a conductive plate 318, or by a conductive plate 320 or a conductive plate 319. The conductive plate 315 and the like are sealed by the first sealing resin 348 in a state where a heat radiation section thereof is exposed and an insulating member 333 is thermally press-fitted to the heat radiation section. As illustrated in FIG. 6, the first sealing resin 348 has a polyhedral, shape (here, substantially rectangular parallelepiped shape).

The module primary sealing body 302 that is sealed by the first sealing resin 348 is inserted into the module case 304 and is thermally press-fitted or an inner surface of the module case 304 that is a CAN type cooler with the insulating member 333 interposed therebetween. Here, the CAN type cooler is a cylindrical cooler having an inserting port 306 on one surface and a bottom on the other surface. A void remaining the inside of the module case 304, is filled with the second sealing resin 351.

The module case 304 is configured of a member having an electrical conductivity, for example, an aluminum alloy material (Al, AlSi, AlSiC, Al—C, and the like). A periphery of the inserting port 306 is surrounded by a flange 304B. Furthermore, as illustrated in FIG. 4(a), a first heat radiation surface 307A and a second heat radiation surface 307B having surfaces wider than those of the other surfaces are arranged in a state of facing each other. Each power semiconductor device (IGBT 328, IGBT 330, diode 156, and diode 166) is disposed so as to face the heat radiation surfaces.

Three surfaces connecting the first heat radiation surface 307A and the second heat radiation surface 307B facing each other configure surfaces that are closed with a width narrower than that of the first heat radiation surface 307A and the second heat radiation surface 307B. The inserting port 306 is formed further on a remaining side. A shape of the module case 304 does not need to be an exact rectangular parallelepiped body and corners may form curved surfaces as illustrated in FIG. 4(a).

It is possible to ensure sealing against the refrigerant the flange 304B by using the metal case having such a shape, even if the module case 304 is inserted into the flow path through which the refrigerant such as water or oil flows. Thus, it is possible to prevent the cooling refrigerant from entering the inside of the module case 304 with a simple configuration. Furthermore, the fins 305 are uniformly formed in the first heat radiation surface 307A and the second heat radiation surface 307B facing each other. Furthermore, the thin section 304A of which the thickness is extremely in is formed on outer peripheries of the first heat radiation surface 307A and the second neat radiation surface 307B. Since the thickness of the thin section 304A is extremely thin to an extent that it is easily deformed by pressing the fins 305, productivity after the module primary sealing body 302 is inserted is improved.

As described above, the conductive plate 315 and the like are thermally press-fitted to the inner wail of the module case 304 through the insulating member 333 and thereby it is possible to reduce the void between the conductive plate 315 and the like, and the inner wall of the module case 304 and to effectively transmit heat generated by the power semiconductor device to the fins 305. Furthermore, the insulating member 333 has a certain thickness and flexibility and thereby it is possible to absorb generation of thermal stress by the insulating member 333 and the insulating member 333 is suitable for use in the bower converter of the vehicle in which the temperature change is severe.

A DC positive electrode wiring 315A and a DC negative electrode wiring 319A made of metal which are electrically connected to the capacitor module 500 are provided on the outside of the module case 304. A DC positive electrode terminal 315B and a DC negative electrode terminal 319B are respectively formed in tip end portions thereof. Furthermore, an AC wiring 320A made of metal for supplying AC power to a motor generator is provided and an AC terminal 320B is formed in a tip end thereof. As illustrated in FIG. 7, in the embodiment, the DC positive electrode wiring 315A is connected to the conductive plate 315, the DC negative electrode wiring 319A is connected to the conductive plate 319, and the AC wiring 320A is connected to the conductive plate 320.

Furthermore, signal wirings 324U and 324L made of metal which are electrically connected to a driver circuit are provided on the outside of the module case 304. A signal terminal 325U and a signal terminal 325L are respectively formed in tip end portions thereof. As illustrated in FIG. 7 in the embodiment, the signal wiring 324U is connected to the IGBT 328 and the signal wiring 324L is connected to the IGBT 328.

The DC positive electrode wiring 315A, the DC negative electrode wiring 319A, the AC wiring 320A, the signal wiring 324U, and the signal wiring 324L are integrally molded as an auxiliary mold body 600 in a state of being insulated together by the wiring insulating section 608 that is molded of a resin material. The wiring insulating section 608 is also operated as a support member for supporting each wiring and for the resin material that is used for the wiring insulating section 608, a thermosetting resin or a thermoplastic resin having an insulating property is suitable. Thus, it is possible to ensure the insulating properties between the DC positive electrode wiring 315A, the DC negative electrode wiring 319A, the AC wiring 320A, the signal wiring 324U, and the signal wiring 324L, and to perform high-density wiring.

The auxiliary body 600 is fixed to the module case 304 by the screws 309 passing through screw holes provided in the wiring insulating section 608 after metal welding is performed in the module primary sealing body 302 and a connection section 370. For the metal welding between the module primary sealing body 302 and the auxiliary mold body 600 in the connection section 370, for example, it is possible to use TIG welding.

The DC positive electrode wiring 315A and the DC negative electrode wiring 319A are laminated together and have shapes extending substantially in parallel in a state of interposing the wiring insulating section 608 therebetween. The DC positive electrode wiring 315A and the DC negative electrode wiring 319A are arranged and shaped as described above and thereby a current instantaneously flowing during a switching operation of the power semiconductor device flows to face in a reverse direction. Thus, magnetic fields created by currents are operated to cancel out each other and low inductance can be achieved by this operation. Moreover, the AC wiring 320A or the signal terminals 325U and 325L extend in the same direction as that of the DC positive electrode wiring 315A and the DC negative electrode wiring 319A.

The connection section 370 in which the module primary sealing body 302 and the auxiliary mold body 600 are connected by metal welding is sealed within the module case 304 by the second sealing resin 351. Thus, since the insulating distance required between the connection section 370 and the module case 304 can be stably ensured, it is possible to realize downsizing of the power semiconductor module 300a compared to a case of not being sealed.

As illustrated in FIG. 7, an auxiliary module-side DC positive electrode connection, terminal 315C, an auxiliary module-side DC negative, electrode connection terminal 319C, an auxiliary module-side AC connection terminal 320C, an auxiliary module-side signal connection terminal 326U, and an auxiliary module-side signal connection terminal 326L are arranged side by side in a row on the auxiliary mold body 600 side of the connection section 370. On the other hand, a device-side DC positive electrode connection terminal 315D, a device-side DC negative electrode connection terminal 319D, a device-side AC connection terminal 320D, a device-side signal connection, terminal 327U, and a device-side signal connection terminal 327L are arranged side by side in a row along one surface of the first sealing resin 348 having a polyhedral shape on the module primary sealing body 302 side of the connection section 370. Thus, a structure is configured such that each terminal is arranged side by side in a row in the connection section 370 and thereby manufacturing of the module primary sealing body 302 by transfer molding is easily performed.

Here, a positional relationship of each terminal will be described when a portion extending from the first sealing resin 348 of the module primary sealing body 302 to the outside is viewed as one terminal for each type. In the following description, terminals configured of the DC positive electrode wiring 315A (including the DC positive electrode terminal 315B and the auxiliary module-side DC positive electrode connection terminal 315C) and the device-side DC positive electrode connection terminal 315C are referred to as positive electrode side terminals. Terminals configured of the DC negative electrode wiring 319A (including the DC negative electrode terminal 319B and the auxiliary module-side DC negative electrode connection terminal 319C) and the device-side DC positive electrode connection terminal 315D are referred to as negative electrode side terminals. Terminals configured of the AC wiring 320A (including the AC terminal 320B and the auxiliary module-side AC connection terminal 320C) and the device-side AC connection terminal 320D are referred to as output terminals. Terminals configured of the signal wiring 324U (including the signal terminal 325U and the auxiliary module-side signal connection terminal 326U) and the device-side signal connection terminal 327U are referred to as upper arm signal terminals. Terminals configured of the signal wiring 324L (including the signal terminal 325L and the auxiliary module-side signal connection terminal 326L) and the device-side signal connection terminal 327L are referred to as lower arm signal terminals.

All of each terminal described above protrudes from the first sealing resin 348 and the second sealing resin 351 through the connection section 370. As described above, each protruding portion (the device-side DC positive electrode connection terminal 315D, the device-side DC negative electrode connection terminal 319D, the device-side AC connection terminal 320D, the device-side signal connection terminal 327U, and the device-side signal connection terminal 327L) from the first sealing resin 348 is arranged side by side in a row along one surface of the first sealing resin 348 having a polyhedral shape. Furthermore, the positive electrode side terminals and the negative electrode side terminals protrude in a state of being laminated from the second sealing resin 351 and extend to the outside of the module case 304. Such a configuration is provided and thereby when a mold is clamped for manufacturing the module primary sealing body 302 by sealing the power semiconductor device with the first sealing resin 348, it is possible to prevent occurrence of an excessive stress of a connection portion between the power semiconductor device and the terminals or a gap of the mold. Furthermore, magnetic fluxes in directions cancelling each other out are generated by currents flowing through each of the laminated positive electrode side terminal, and negative electrode side terminal in the opposite direction. Thus, it is possible to achieve low inductance.

The auxiliary module-side DC positive electrode connection terminal 315C and the auxiliary module-side DC negative electrode connection terminal 319C are respectively formed in tip end portions of the DC positive electrode wiring 315A and the DC negative electrode wiring 319A opposite to the DC positive electrode terminal 315B and the DC negative electrode terminal 319B on the auxiliary module 600 side. Furthermore, the auxiliary module-side AC connection terminal 320C is formed in the tip end portion opposite to the AC terminal 320B in the AC wiring 320A. The auxiliary module-side signal connection terminals 326U and 326L are respectively formed in tip end portions opposite to the signal terminals 325U and 325L in the signal wirings 324U and 324L.

On the other hand, the device-side DC positive electrode connection terminal 315C and the device-side DC negative electrode connection terminal 319D, and the device-side AC connection terminal 320D are respectively formed in the conductive plates 315, 319, and 320 on the module primary sealing body 302 side. Furthermore, the device-side signal connection terminals 327D and 327L are respectively connected to the IGBTs 328 and 330 by a bonding wire 371.

As illustrated in FIG. 8, the DC positive electrode-side conductive plate 315, the AC output-side conductive plate 320, and the device-side signal connection terminals 327U and 327L are integrally machined so as to be arranged substantially on the same plane in a state of being connected to a common tie bar 372. A collector electrode of the upper arm-side IGBT 328 and a cathode electrode of the upper arm-side diode 156 are fixed to the conductive plate 315. A collector electrode of the lower arm-side IGBT 330 and a cathode electrode of the lower arm-side diode 166 are fixed to the conductive plate 320. The conductive plate 318 and the conductive plate 319 are arranged substantially in the same plane shape on the IGBTs 328 and 330, and the diodes 155 and 166. An emitter electrode of the upper arm-side IGBT 328 and an anode electrode of the upper arm-side diode 156 are fixed to the conductive plate 318. An emitter electrode of the lower arm-side IGBT 330 and an anode electrode of the lower arm-side diode 166 are fixed to the conductive plate 319. Each power semiconductor device is fixed to a device fixing section 322 provided in each conductive plate through a metal welding material 160. For example, the metal welding material 160 is a solder material, a silver sheet, a low-temperature sintering welding material containing fine metal particles, and the like.

Each power semiconductor device has a plate-shaped flat structure and each electrode of the power semiconductor device is formed on front and back surfaces thereof. As illustrated in FIG. 8, each electrode of the power semiconductor device is held by the conductive plate 315 and the conductive plate 318, or the conductive plate 320 and the conductive plate 319. That is, the conductive plate 315 and the conductive plate 318 are laminated and disposed to face each other substantially in parallel through the IGBT 328 and the diode 156. Similarly, the conductive plate 320 and the conductive plate 319 are laminated and disposed to face each other substantially in parallel through the IGBT 330 and the diode 166. Furthermore, the conductive plate 320 and the conductive plate 318 are connected through an intermediate electrode 329. The upper arm circuit and the lower arm circuit are electrically connected to each other by this connection and the upper and lower arm series circuits are formed. As described above, the IGBT 328 and the diode 156 are held between the conductive plate 315 and the conductive plate 318, and the IGBT 330 and the diode 166 are held between the conductive plate 320 and the conductive plate 319. The conductive plate 320 and the conductive plate 318 are connected through the intermediate electrode 329. Thereafter, a control electrode 328A of the IGBT 328 and the device-side signal connection terminal 327U are connected by the bonding wire 371, and a control electrode 330A of the IGBT 330 and the device-side signal connection terminal 327L are connected by the bonding wire 371.

Figure 9A:
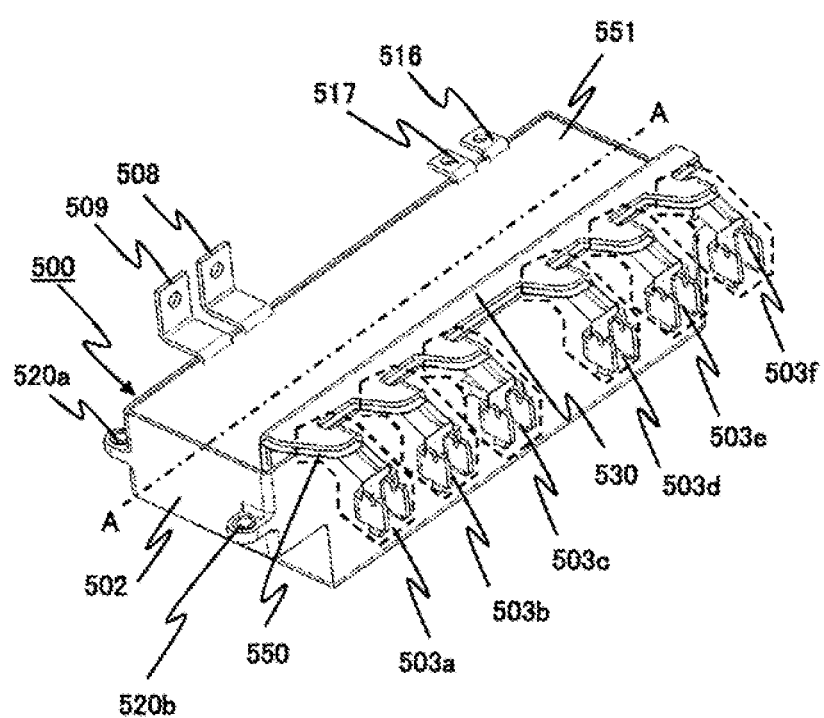
FIG. 9A is a perspective view of a capacitor module 500.
Figure 9B:
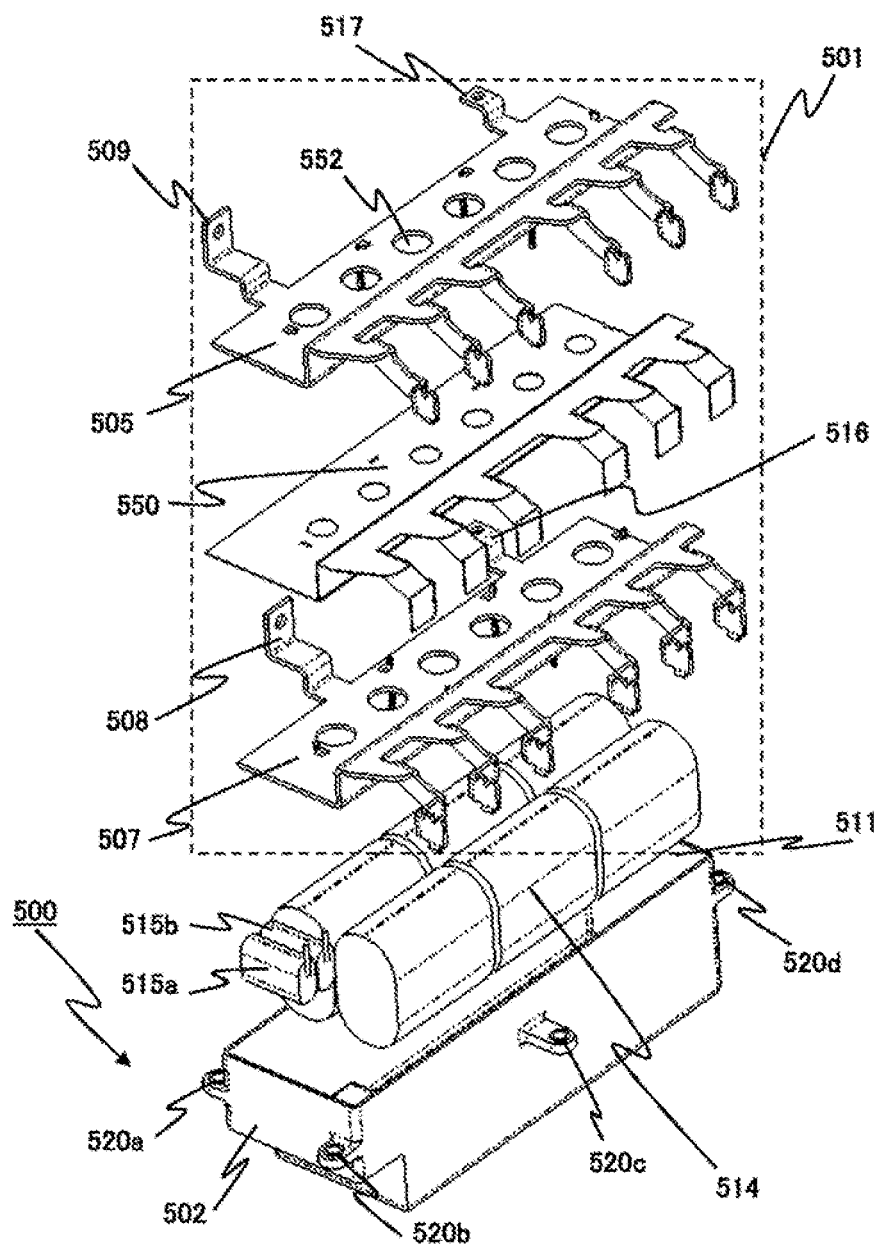
FIG. 9B is an exploded perspective view describing an internal structure of the capacitor module 500.

FIG. 9(a) is a perspective view of the capacitor module 500. FIG. 9(b) is an exploded perspective view describing an internal structure of the capacitor module 500. A laminated conductive plate 501 is configured of a negative electrode conductive plate 505 and a positive electrode conductive plate 507 which are formed of a plate-like wide conductor, and an insulating sheet 550 which is held by the negative electrode conductive plate 505 and the positive electrode conductive plate 507. The laminated conductive plate 501 cancels magnetic fluxes from one another with respect to currents flowing through the upper and lower arm series circuits of each phase and achieves low inductance with respect to the currents flowing through the upper and lower arm series circuits.

A negative electrode-side power supply terminal 508 and a positive electrode-side power supply terminal 509 are formed to be raised from one side of the laminated conductive plate 501 in a longitudinal direction, and are respectively connected to the positive electrode conductive plate 507 and the negative electrode conductive plate 505. Auxiliary capacitor terminals 516 and 517 are formed to be raised from one side of the laminated conductive plate 501 in a longitudinal direction, and are respectively connected to the positive electrode conductive plate 507 and the negative electrode conductive plate 505.

A relay conductive section 530 is formed to be raised from one side of the laminated conductive plate 501 in a longitudinal direction. Capacitor terminals 503a to 503c protrude from an end portion of the relay conductive section 530 and are formed corresponding to each of the power semiconductor modules 300a to 300c. Furthermore, capacitor terminals 503d to 503f also protrude from the end portion of the relay conductive section 530 and are formed corresponding to each of the power semiconductor modules 301a to 301c. All the relay conductive section 530 and the capacitor terminals 503a to 503c are configured in a state of being laminated with the insulating sheet 550 interposed therebetween, and achieve low inductance with respect to the current flowing through the upper and lower arm series circuits 150. Furthermore, the relay conductive section 530 has no through hole and the like which disturb the flow of the current or has through holes as few as possible.

A reflex current generated when switching between the power semiconductor modules 300a to 300c provided for each phase is likely to flow to the relay conductive section 530 and is unlikely to flow to the laminated conductive plate 501 side. Thus, it is possible to reduce heat generation of the laminated conductive plate 501 by the reflex current.

Moreover, in the embodiment, the negative electrode conductive plate 505, the positive electrode conductive plate 507, a battery of the negative electrode-side terminal 508, a battery of the negative electrode-side terminal 509, the relay conductive section 530, and the capacitor terminals 503a to 503f are configured of a metal plate which is integrally molded and have an effect of reducing inductance with respect to the current flowing through the upper and lower arm series circuits.

A plurality of capacitor cells 514 are provided below the laminated conductive plate 501. In the embodiment, three of the capacitor cells 514 are arranged side by side in a row along one side of the laminated conductive plate 501 in the longitudinal direction and further another three of the capacitor cells 514 are arranged side by side in a row along the other side of the laminated conductive plate 501 in the longitudinal direction, and thereby a total of six capacitor cells are provided.

The capacitor cells 514 arranged side by side in a row along each side of the laminated conductive plate 501 in the longitudinal direction are arranged symmetrically at a boundary with a dotted line AA illustrated in FIG. 9(a). Thus, if the DC current that is smoothed by the capacitor cells 514 is supplied to the power semiconductor modules 300a to 300c, and the power semiconductor modules 301a to 301c, current balance between the capacitor terminals 503a to 503c and the capacitor terminals 503d to 503f is uniform, and it is possible to reduce the inductance of the laminated conductive plate 501. Furthermore, since the current can be prevented from locally flowing in the laminated conductive plate 501, heat balance is uniform and it is possible to improve thermal resistance.

The capacitor cell 514 is a unit structure of a power storage section of the capacitor module 500, two sheets of films, made of metal such as aluminum, are deposited on one surface and are laminated and wound, and thereby a film capacitor is used in which the two sheets of metal become respectively the positive, electrode and the negative electrode. Wound axial surfaces of the electrodes of the capacitor cell 514 become respectively the positive electrode and the negative electrode and are manufactured by spraying of a conductive material such as tin.

A capacitor case 502 includes a housing section 511 for housing the capacitor cells 514 and the housing section 511 has an upper surface and a lower surface having substantially rectangular shapes. The capacitor case 502 is provided with holes 520a to 520h through which fixing units pass, for example, screws for fixing the capacitor module 500 to the flow path forming body 12 pass. The capacitor case 502 of the embodiment is configured of resin having high thermal conductivity to improve the thermal conductivity, but may be configured of metal and the like.

Furthermore, after the laminated conductive plate 501 and the capacitor cells 514 are housed in the capacitor case 502, an inside of the capacitor case 502 is filled with a filling material 551 except the capacitor terminals 503a to 503f, the negative electrode-side power supply terminal 508, and the positive electrode-side power supply terminal 509 to cover the laminated conductive plate 501.

In the embodiment, the seventh flow path section 19g and the ninth flow path section 19i are provided along a longitudinal direction of the housing section 511 of the capacitor module 500 (see FIG. 3) and cooling efficiency is improved. Furthermore, the capacitor cells 514 are disposed such that one of electrode surfaces of the capacitor cells 514 is disposed so as to face an inner wall forming a side of the housing section 511 in the longitudinal direction. The inner wall forming the side of the housing section 511 in the longitudinal direction is formed to face the second flow path section 19b, the third flow path section 19c, the fourth flow path section 19d, the fifth flow path section 19e, and the sixth flow path section 19f. Thus, since heat is likely to be transmit in the direction of the winding axis of the film, the heat is likely to escape to the capacitor case 502 through the electrode surfaces of the capacitor cells 514.

Furthermore, a noise filter capacitor cell 515a is connected to the positive electrode conductive plate 507 and removes predetermined noise generated between the positive electrode and a ground. A noise filter capacitor cell 515b is connected to the negative electrode conductive plate 505 and removes predetermined noise generated between the negative electrode and the ground. The noise filter capacitor cells 515a and 515b are set such that the capacities thereof are smaller than that of the capacitor cell 514. Furthermore, the noise filter capacitor cells 515a and 515b are disposed closer to the negative electrode-side power supply terminal 508 and the positive electrode-side power supply terminal 509 than the capacitor terminals 503a to 503f. Thus, it is possible to quickly remove predetermined noise mixed in the negative electrode-side power supply terminal 508 and the positive electrode-side power supply terminal 509, and to reduce effects of the noise on the power semiconductor module.

Figure 10:
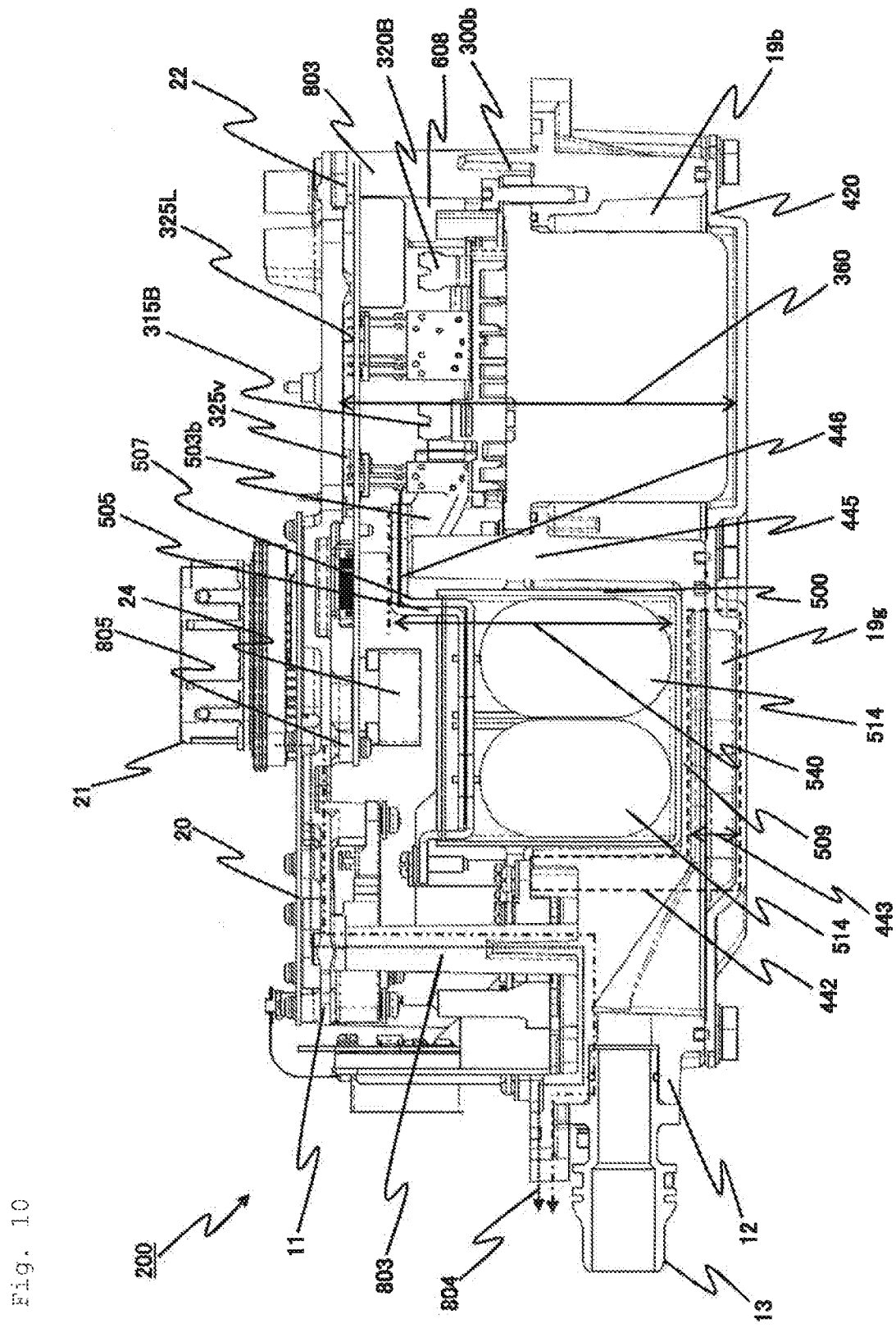
FIG. 10 is a sectional view of a power converter 200 that is cut in a cross section A-A of FIG. 1.

FIG. 10 is a sectional view of the power converter 200 that is cut in surface A-A of FIG. 1.

A power semiconductor module 300b is housed within the second flow path section 19b illustrated in FIG. 3. An external wall of the module case 304 comes into direct contact with the cooling refrigerant flowing through the second flow path section 19b. The other power semiconductor modules 300a to 300c, and the power semiconductor modules 301a to 301c are also housed on the inside of each flow path section similar to the power semiconductor module 300b.

The power semiconductor module 300b is disposed in a side portion of the capacitor module 500. A height 540 of the capacitor module is formed so as to be smaller than that of a height 360 of the power semiconductor module. Here, the height 540 of the capacitor module is a height from the bottom surface portion of the capacitor case 502 to a capacitor terminal 503b and the height 360 of the power semiconductor module is a height from the bottom surface portion of the module case 304 to a tip end of the signal terminal 325U.

Then, the second flow path forming body 442 is provided with the seventh flow path section 19g and the ninth flow path section 19i disposed below the capacitor module 500. That is, the seventh flow path section 19g and the ninth flow path section 19i are disposed side by side with the capacitor module 500 along a height direction of the power semiconductor module 300b. A height 443 of the seventh flow path section is less than the difference between the height 360 of the power semiconductor module and the height 540 of the capacitor module. Moreover, the height 443 of the seventh flow path section may he equal to the difference between the height 360 of the power semiconductor module and the height 540 of the capacitor module. Heights of the seventh flow path section 19g and the ninth flow path section 19i are equal to each other.

On the other hand, since fixing and connecting operations of the power semiconductor module 300b and the capacitor module 500 can be performed on the same plane, it is possible to improve assemblability.

On the other hand, the height 540 of the capacitor module is suppressed to be lower than the height 360 of the power semiconductor module and thereby the seventh flow path section 19g can be disposed below the capacitor module 500. Thus, it is also possible to cool the capacitor module 500. The height of the upper portion of the capacitor module 500 and the upper portion of the power semiconductor module 300b becomes a short distance and thereby it is possible to prevent the capacitor terminal 503b from being lengthened in the height direction of the capacitor module 500.

On the other hand, the seventh flow path section 19g and the ninth flow path section 19i are disposed below the capacitor module 500 and thereby it is possible to avoid disposing of a cooling flow path in the side portion of the capacitor module 500. Thus, it is possible to prevent a wiring distance between the capacitor module 500 and the power semiconductor module 300b from increasing by disposing the capacitor module 500 and the power semiconductor, module 300b close to each other.

Furthermore, the driver circuit substrate 22 has a transformer 24 that generates driving power supply of the driver circuit. A height of the transformer 24 is formed so as to be (greater than a height of the circuit components mounted on the driver circuit substrate 22. The signal terminal 325U or the DC positive electrode terminal 315B are disposed in a space between the driver circuit substrate 22, the power semiconductor modules 300a to 300c, and the power semi conductor modules 301a to 301c. On the other hand, the transformer 24 is disposed in a space between the driver circuit substrate 22 and the capacitor module 500. Thus, it is possible to effectively use the space between the driver circuit substrate 22 and the capacitor module 500. Furthermore; the circuit components of which have aligned heights are mounted on a surface opposite to a surface in which the transformer 24 of the driver circuit substrate 22 is disposed and thereby it is possible to suppress the distance between the driver circuit substrate 22 and the metal base plate 11.

Figure 11:
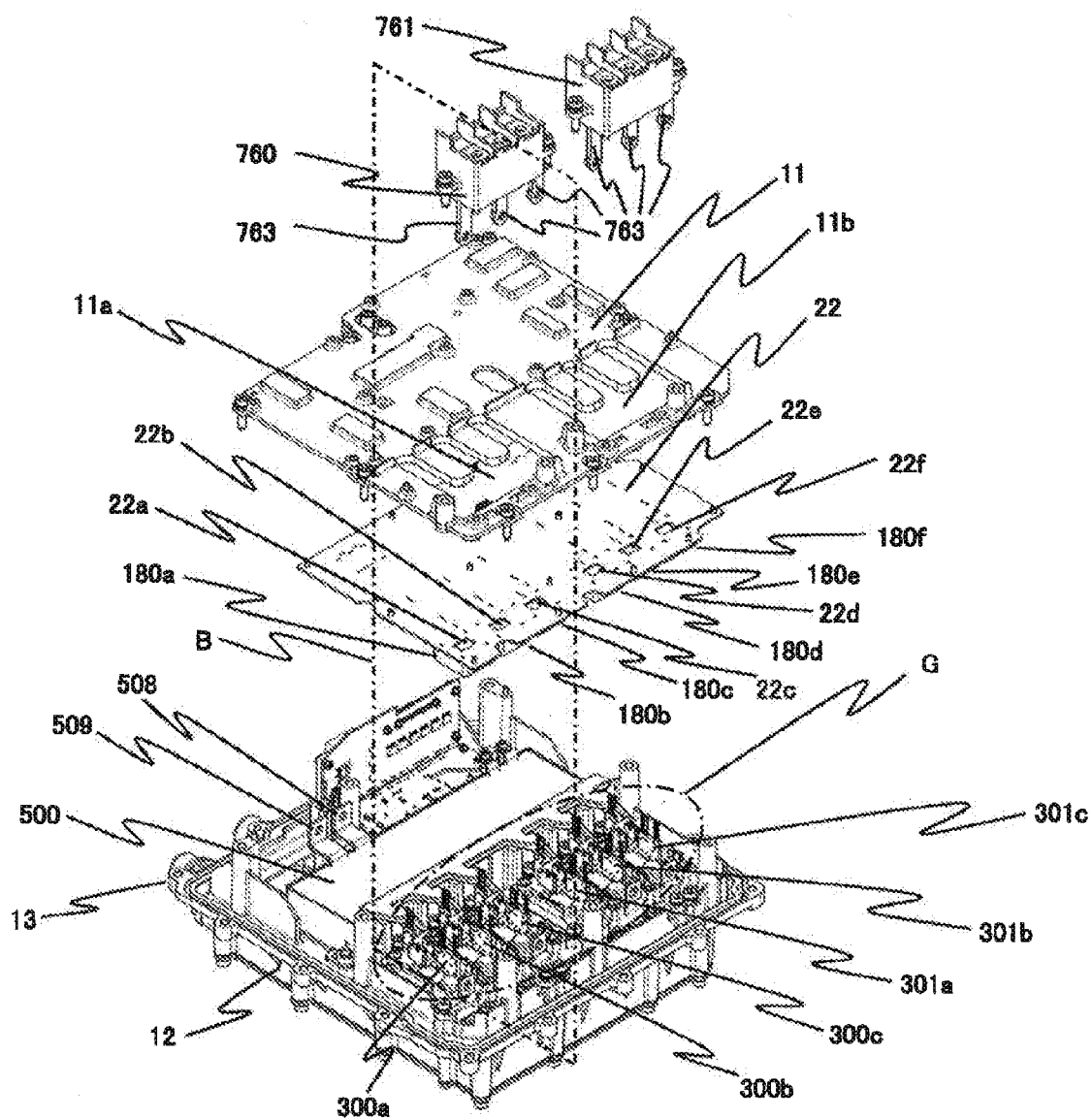
FIG. 11 is a perspective view in which a driver circuit substrate 22, a metal base plate 11, and AC terminal blocks 760 and 761 are disassembled, and a lid 8 and a control circuit substrate 20 are removed.

FIG. 11 is an entire perspective view in which the lid 8 and the control circuit substrate 20 are removed, and the driver circuit substrate 22, the base plate 11, and the AC terminal blocks 760 and 761 are disassembled.

The driver circuit substrate 22 is disposed in an upper portion of the power semiconductor modules 300a to 300c and the power semiconductor modules 301a to 301c. The metal base plate 11 is disposed on a side opposite to the power semiconductor modules 300a to 300c and the power semiconductor modules 301a to 301c with the driver circuit substrate 22 interposed therebetween.

The driver circuit, substrate 22 forms through holes 22a to 22c through which an AC bus bar 763 passes. The driver circuit substrate 22 forms through holes 22d to 22f through which the AC bus bar 763 passes.

In the embodiment, a current sensor 180a is fitted into the through hole 22a, a current sensor 180b is fitted into the through hole 22b, a current sensor 180c is fitted into the through hole 22c, a current sensor 180d is fitted into the through hole 22d, a current sensor 180e is fitted into the through hole 22e, and a current sensor 180f is fitted into the through hole 22f.

It is possible to directly dispose the current sensors to the driver circuit substrate 22, to simplify wiring of the AC bus bar 763 forming the AC terminal blocks 760 and 761, and to contribute to downsizing by providing the through holes 22a to 22f in the driver circuit substrate 22.

Furthermore, the current sensor 180a and the like are disposed in a space between the driver circuit substrate 22, the power semiconductor modules 300a to 300c and the power semiconductor modules 301a to 301c. The power semiconductor modules 300a to 300c and the power semiconductor modules 301a to 301c have the DC positive electrode terminal 315B and the like, and the DC positive electrode terminal 315B and the like are necessary to ensure a sufficient insulating distance with the driver circuit substrate 22.

In order to ensure the insulating distance, it is possible to share the space within the power converter as the insulating space and the arrangement, space of the current sensors by disposing the current sensor 180a and the like within the space for ensuring the insulating distance. Thus, it leads to downsizing of the power converter.

The base plate 11 has a through hole 11a at a position facing the through holes 22a to 22c and a through hole 11b a position facing the through holes 22d to 22l. Furthermore, as illustrated in FIG. 1, the lid 8 has the third opening 204a at a position facing the through hole 11a thereby forming an AC connector 188. Furthermore, the lid 8 has the fourth opening 204b at a position facing the through hole 11b thereby forming an AC connector 188.

Thus, even if the driver circuit, substrate 22 is disposed between the AC connector 188 and the power semiconductor modules 301a to 301c, it is possible to suppress complication of wiring of the AC bus bar 763 forming the AC terminal blocks 760 and 761 and to achieve downsizing of the power converter 200.

Furthermore, the through holes 22a to 22c are provided in the driver circuit substrate 22 along an arrangement direction of the AC bus bar 763. Furthermore, the driver circuit substrate 22 has a rectangular shape of which one side is a side of the capacitor module 500 in the longitudinal direction and the other side is a combined length of a side of the capacitor 500 in the lateral direction and sides of the power semiconductor modules 300a to 300c and the power semiconductor modules 301a to 301c in the longitudinal direction.

Thus, since the through holes 22a to 22c are disposed along one side of the driver circuit substrate 22, even if a plurality of through holes are provided, it is possible to ensure a circuit wiring area that has a wide range.

As illustrated in FIG. 1, the control circuit substrate 20 is disposed facing one surface of the lid 8 forming the first opening 202. Then, the connector 21 is directly mounted on the control circuit substrate 20 and protrudes to the outside through the first opening 202 formed in the lid 8. Thus, it is possible to effectively use the space within the power converter 200.

Furthermore, since the control circuit substrate 20 on which the connector 21 is mounted is fixed to the base plate 11, even if a physical force is applied from the outside of the connector 21, a load to the control circuit substrate 20 is suppressed. Thus, improvement of reliability including durability is expected.

Figure 12:
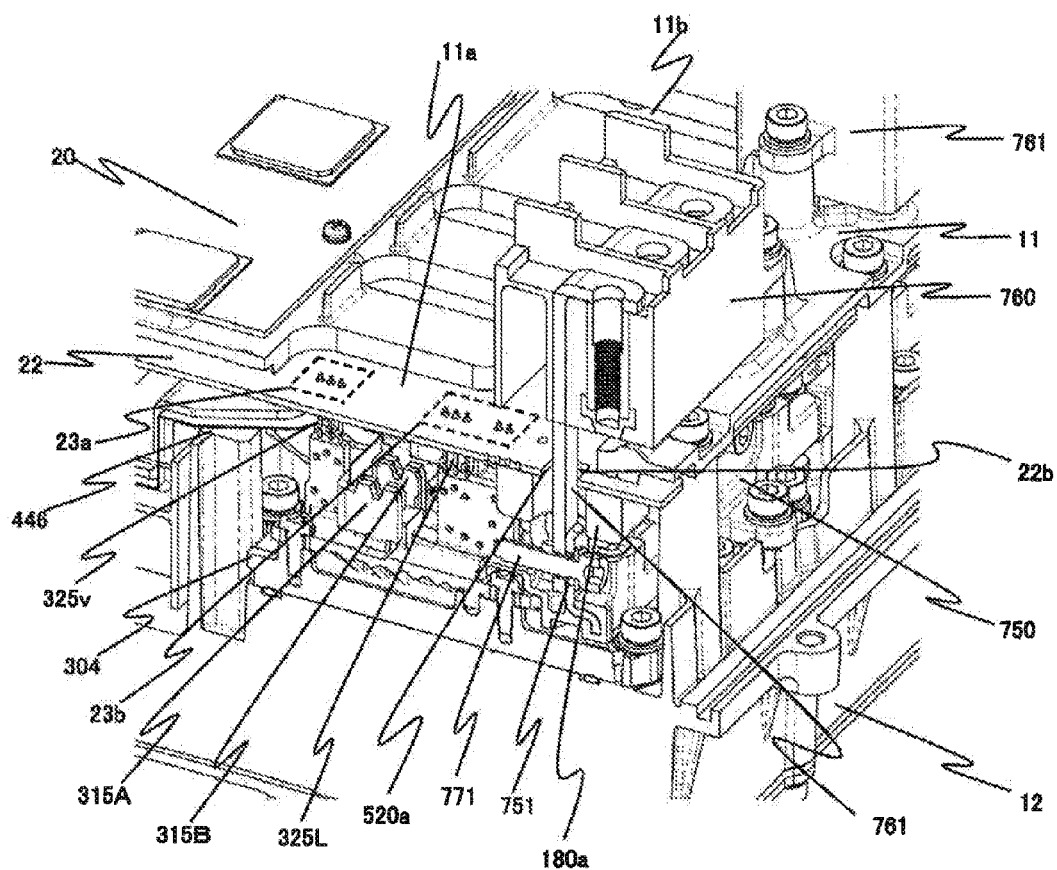
FIG. 12 is a sectional perspective view that is cut in a cross section B of FIG. 11.

FIG. 12 is a sectional perspective view that is cut in surface B of FIG. 11. A connection section 23a is a connection section between the signal terminal 325U of the power semiconductor module 300a and the driver circuit substrate 22. A connection section 23b is a connection section between the signal terminal 325L of the power semiconductor module 300a and the driver circuit substrate 22. The connection sections 23a and 23b are formed by a soldering material.

The through hole 11a of the base plate 11 is formed to be at a position facing the connection sections 23a and 23b. Thus, in a state where the driver circuit substrate 22 is fixed to the base plate 11, it is possible to perform a connection operation of the connection sections 23a and 23b through the through hole 11a of the metal base plate 11.

Furthermore, if the control circuit substrate 20 is projected from the upper surface of the power converter 200, the control circuit substrate 20 is disposed such that a projection section of the control circuit substrate 20 does not overlap a projection section of the through hole 11a. Thus, the control circuit substrate 20 does not hinder the connection operation of the connection sections 23a and 23b and the control circuit substrate 20 can reduce an influence of electromagnetic noise from the connection sections 23a and 23b.

In the embodiment, the driver circuit substrate 22 is largely formed, so as to face the power semiconductor module 300a and the like, and the capacitor module 500. Also, in this case, the AC terminal 320B is disposed away from the capacitor module 500 more than the DC positive electrode terminal 315B. Furthermore, a control terminal 325L is disposed between the DC positive electrode terminal 315B and the AC terminal 320B. Furthermore, the connection section 23b is disposed at a position facing the control terminal 325L.

Thus, the through hole 22b is disposed on a side closer to an edge side of the driver circuit substrate 22 than the driver circuit 25 on the driver circuit substrate 22. Thus, it is possible to suppress decrease of the strength of the driver circuit substrate 22 and to improve the vibration resistance performance by forming the through hole 22b.

Figure 13:
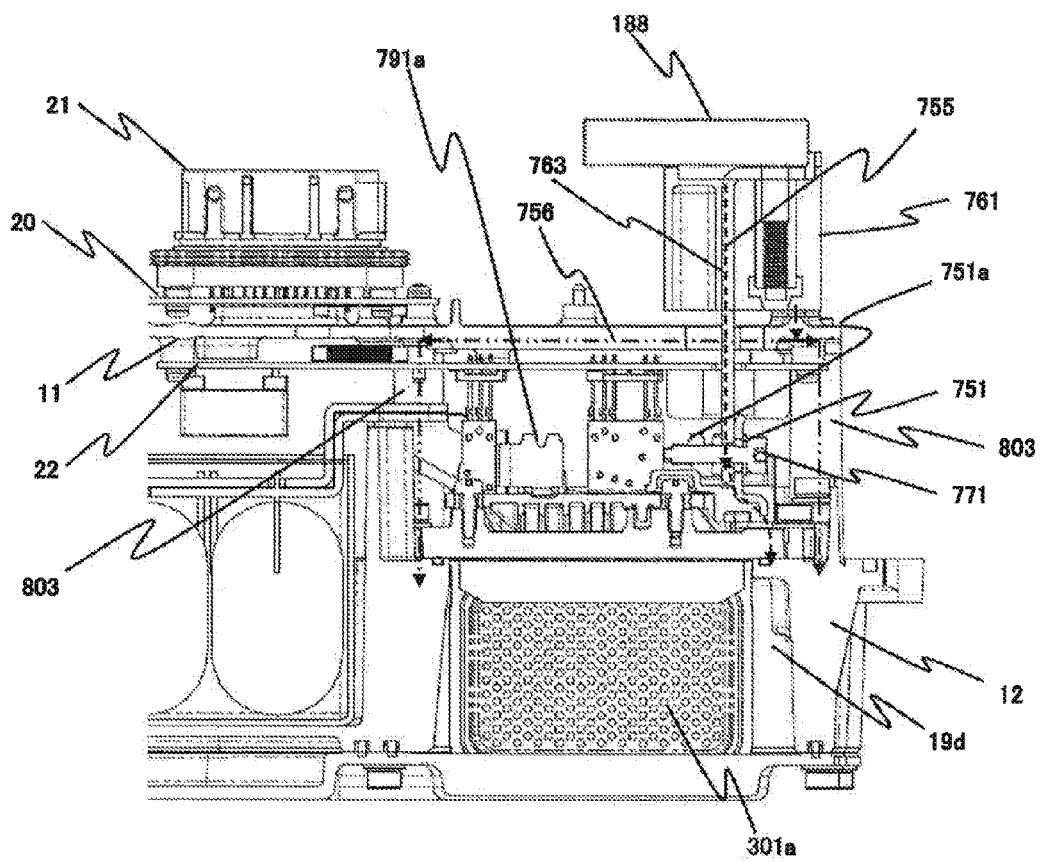
FIG. 13 is a sectional view of the power converter 200 that is cut in a cross section F-F of FIG. 1.

FIG. 13 is a sectional view of the power converter 200 that is cut in surface F-F of FIG. 1. All the AC relay bus bar 751 and the AC terminal block 761 are supported by the flow path forming body 12 having a function as a casing. Thus, a stress of load applied during mounting of the AC connector 188 of the motor is dispersed to the flow path forming body 12 in an arrow direction 755 indicated by a dotted line through the AC terminal block 761. Furthermore, a stress of load that is not completely dispersed by the AC terminal block 761 is dispersed to the flow path forming body 12 in an arrow direction 756 indicated by a two-dotted chain line through the AC relay bus bar 751 from the AC bus bar 763.

Thus, until the load applied during mounting the AC connector 188 of the motor reaches an AC welding connection section 751a, the stress is dispersed in two steps and it is possible to positively exclude the stress generated to the welding section.

Furthermore, the AC relay bus bar 751 is weld-connected to the AC terminal 320B of the power semiconductor module 301a. Furthermore, the AC terminal, block 761 is connected to the AC connector 188 of the motor and is connected to the AC relay bus bar 751. Thus, it is possible to maintain an effect of reduction, of the stress generating to the welding section and to easily employ a structure in which an output direction of the AC connector 188 of the motor can be one of an upper surface direction and a side surface direction of the power semiconductor module 301a by only changing the shape of the AC bus bar 763 forming the AC terminal block 761.

A metal support member 803 protrudes from the flow path forming body 12 and is connected to the flow path forming body 12. The metal base plate 11 is supported by a tip end portion of the support member 803. The flow path forming body 12 is electrically connected to the ground. A flow 804 of a leakage current indicates a flow direction of the leakage current flowing through the metal base plate 11, the support member 803, and the flow path forming body 12 in order from the driver circuit, substrate 22. Furthermore, a flow 805 of the leakage current indicates a flow direction of the leakage current flowing through the metal base plate 11, the support member 803, and the flow path forming body 12 in order from the control circuit; substrate 20. Thus, it is possible to allow the leakage current of the control circuit substrate 20 and the driver circuit substrate 22 to efficiently flow to the ground.

Figure 14A:
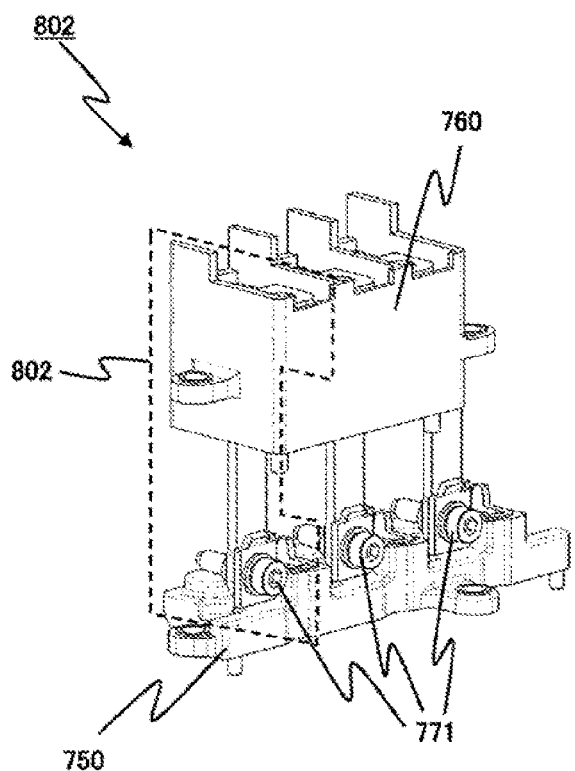
FIG. 14A is a perspective view of an AC-side relay conductor 802.
Figure 14B:
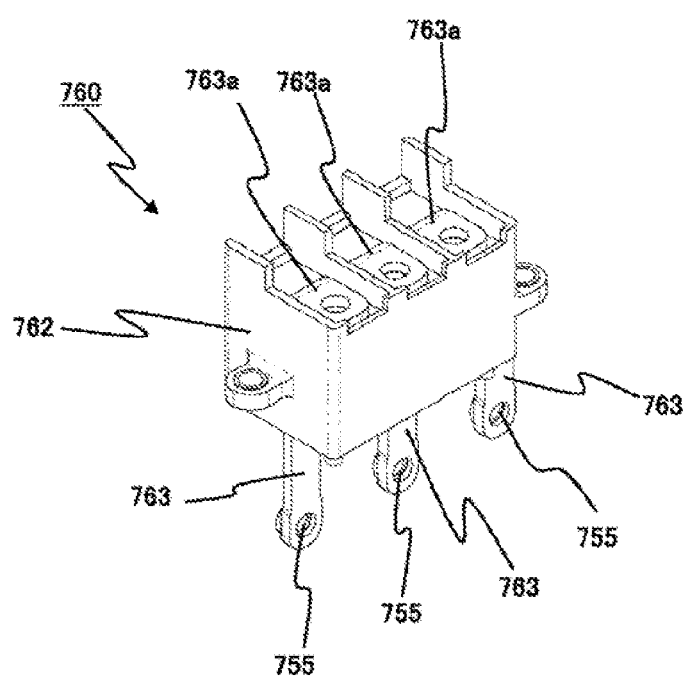
FIG. 14B is a perspective view illustrating an external appearance of the AC terminal block 760.
Figure 14C:
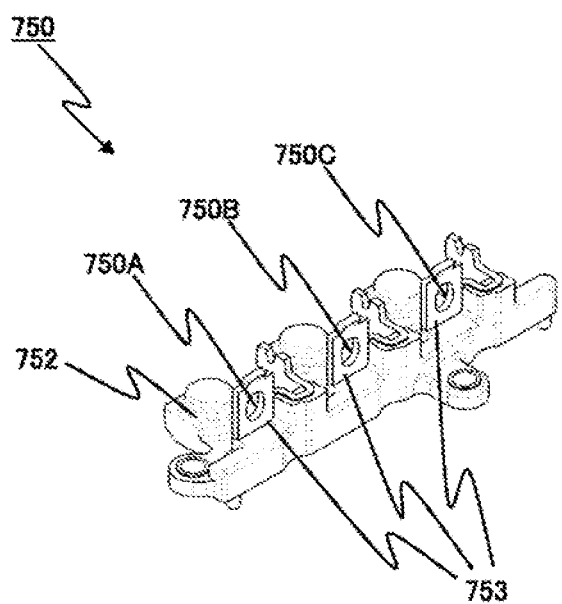
FIG. 14C is a perspective view illustrating an external appearance of an AC relay bus bar 750.

FIG. 14(*a*) is a perspective view of an AC-side relay conductor 802 configured of the AC terminal, block 760 and the AC relay bus bar 750. FIG. 14(*b*) is a perspective view of the AC terminal block 760. FIG. 14(*c*) is a perspective view of the AC relay bus bar 750.

Since the AC terminal block 760 and the AC terminal block 761 have the same structure, the AC terminal block 760 is described as a representative. Furthermore, since the AC relay bus bar 750 and the AC relay bus bar 751 have the same structure, the AC terminal block 750 is described as a representative.

As illustrated in FIG. 14(*b*), the AC terminal block 760 is configured such that the AC bus bar 763 and a resin block 762 are integrally formed. As illustrated in FIG. 14(*a*), the AC bus bar 763 is mechanically connected to the AC relay bus bar 750 by screws and the like in an lower portion thereof.

Furthermore, the AC connector 188 is mounted on and mechanically connected to an upper portion 763*a* of the AC bus bar 763. As described above, since both ends of the AC bus bar 763 are mechanically conned by screws and the like, it is possible to select an inexpensive material having no weldability.

Figure 15:
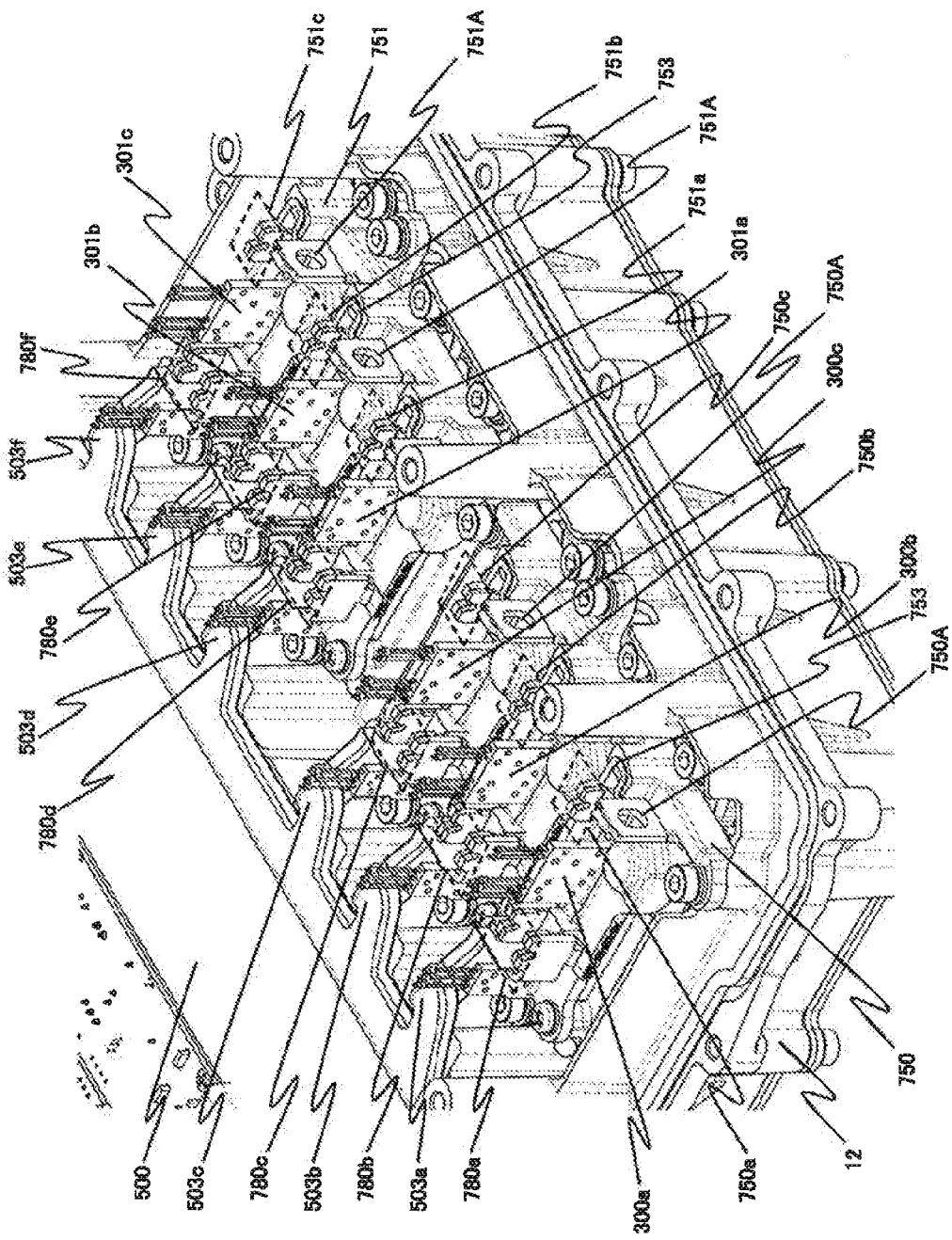
FIG. 15 is a perspective view describing weld connection sections of power semiconductor modules 300a to 300c and 301a to 301c in which the lid 8, the control circuit substrate 20, the metal base plate 11, the driver circuit substrate 22, and the AC terminal blocks 760 and 761 are removed.

As illustrated in FIG. 14(*c*), the AC relay bus bar 750 is configured such that a relay bus bar 753 and an insulating member 752 are integrally formed. As illustrated in FIG. 15 described later, one end of the relay bus bar 753 is weld-connected to the power semiconductor modules 300*a* to 300*c* and the power semiconductor modules 301*a* to 301*c*. Thus, the relay bus bar 753 is necessary to use a material having weldability. Furthermore, the relay bus bar 753 and the AC bus bar 763 are connected by first fastening members 771 passing through through holes 755 formed in the relay bus bar 753.

In this case, the through hole 755 has an elliptical shape of which a long diameter is formed along an arrangement direction of the AC terminal block 760 and the AC relay bus bar 750. Thus, it is possible to allow variation due to assembly of the AC terminal block 760 and the AC relay bus bar 750 within a tolerance. Thus, it is possible to keep a tolerance variation of a mounting surface of the AC connector 188 of the motor to the minimum and to reduce the stress generated to the welding section to the minimum.

Furthermore, the AC relay bus bar 750 is configured such that the relay bus bar 753 and the insulating member 752 are integrally formed. Furthermore, the AC terminal blocks 760 and 761 are configured such that the AC bus bar 763 and the resin block 762 are integrally formed.

FIG. 15 is a perspective view describing weld connection sections of the power semiconductor modules 300*a* to 300*c* and 301*a* to 301*c* in which the lid 8, the control circuit substrate 20, the metal base plate 11, the driver circuit substrate 22, and the AC terminal blocks 760 and 761 are removed.

The relay bus bar 753 is connected to the AC terminal 320B of the power semiconductor module 301*a* by the welding connection and forms an AC welding connection section 750*a* or 751*a*. That is, the relay bus bar 753 is necessary to select a material having weldability to perform weld connection. On the other hand, as illustrated in FIG. 14(*a*), the AC bus bar 763 is only mechanically connected to the relay bus bar 753. Thus, for the AC bus bar 763, a material having no can be selected.

Thus, since the AC bus bar 763 has a high degree of freedom of material selection with respect to the relay bus bar 753, it is possible to reduce the material cost by selecting a less expensive material. Furthermore, a volume of the relay bus bar 753 is smaller than a volume of the AC bus bar 763 and thereby it is possible to further suppress the cost.

Furthermore, for the AC welding connection section 750*a* or 751*a*, it is necessary to ensure reliability including strength against vibration or impact. Thus, it is preferable that thicknesses of the relay bus bar 753 and the AC terminal 320B become the seine as much as possible. That is, the relay bus bar 753 is limited in selection of the material and the thickness, but the AC bus bar 763 is not limited in selection of the material and the thickness by the welding connection and improvement of a degree of design freedom can be expected.

A mating section of the capacitor terminal 503*a*, the DC positive electrode terminal 315B, and the DC negative electrode terminal 319B is weld-connected and thus a DC weld connection section 780*a* is formed.

A mating section of the capacitor terminal 503*b*, the DC positive electrode terminal 315B, and the DC negative electrode terminal 319B is weld-connected and thus a DC weld connection section 780*b* is formed.

A mating section of the capacitor terminal 503*c*, the DC positive electrode terminal 315B, and the DC negative electrode terminal 319B is weld-connected and thus a DC weld connection section 780*c* is formed.

A mating section of the capacitor terminal 503*d*, the DC positive electrode terminal 315B, and the DC negative electrode terminal 319B is weld-connected and thus a DC weld connection section 780*d* is formed.

A mating section of the capacitor terminal 503*e*, the DC positive electrode terminal 315B, and the DC negative electrode terminal 319B is weld-connected and thus a DC weld connection section 780*e* is formed.

A mating section of the capacitor terminal 503*f*, the DC positive electrode terminal 315B, and the DC negative electrode terminal 319B is weld-connected and thus a DC weld connection section 780*f* is formed.

In this case, all the capacitor module 500 forming the DC weld connection sections 780*a* to 780*f*, the power semiconductor modules 300*a* to 300*c*, and the power semiconductor modules 301*a* to 301*c* are mounted on the flow path forming body 12. That is, the capacitor module 500, the power semiconductor modules 300*a* to 300*c*, and the power semiconductor modules 301*a* to 301*c* are fixed to a base stand (flow path forming body 12) that is integrally formed. Thus, since a frequency of a resonance point is expected to be kept high during vibration of the DC weld connection sections 780*a* to 780*f*, it is possible to improve reliability of the welding section.

Furthermore, a mating section of the relay bus bar 753 and the power semiconductor module 300*a* is weld-connected and thus an AC welding connection section 750*a* is formed.

A mating section of the relay bus bar 753 and the power semiconductor module 300*b* is weld-connected and thus an AC welding connection section 750*b* is formed.

A mating section of the relay bus bar 753 and the power semiconductor module 300*c* is weld-connected and thus an AC welding connection section 750*c* is formed.

A mating section of the relay bus bar 753 and the power semiconductor module 301*a* is weld-connected and thus an AC welding connection section 751*a* is formed.

A mating section of the relay bus bar 753 and the power semiconductor module 301*b* is weld-connected and thus an AC welding connection section 751*b* is formed.

A mating section of the relay bus bar 753 and the power semiconductor module 301*c* is weld-connected and thus an AC welding connection section 751*c* is formed.

In this case, the AC relay bus bars 750 and 751 forming the AC welding connection sections 750*a* to 750*c* or 751*a* to 751*c* are mounted on the flow path forming body 12. As described above, also all the power semiconductor modules 300*a* to 300*c* and the power semiconductor modules 301*a* to 301*c* are mounted on the flow path forming body 12. That is, the AC relay bus bars 750 and 751, the power semiconductor modules 300*a* to 300*c*, and the power semiconductor modules 301*a* to 301*c* are fixed to the base stand (flow path forming body 12) that is integrally formed. Thus, similar to the DC weld connection sections 780*a* to 780*f*, in the AC welding connection sections 750*a* to 750*c* and 751*a* to 751*c*, since the frequency of resonance point is expected to be kept high during vibration, it is possible to improve reliability of the welding section.

Furthermore, the flow path forming body 12 has the first flow path forming body 441 (see FIG. 3) for cooling the power semiconductor modules 300*a* to 300*c* and 301*a* to 301*c*. The AC relay bus bars 750 and 751 are mounted close to the power semiconductor modules 300*a* to 300*c* and the power semiconductor modules 301*a* to 301*c*. That is, the flow path forming body 441 and the AC relay bus bars 750 and 751 are disposed extremely close to each other. Thus, as illustrated in FIG. 13, the heat from the AC connector 188 is transmitted from the AC bus bar 763 to the relay bus bar 753 in the arrow direction 755 indicated by the dotted line. Furthermore, the heat from the AC connector 188 is cooled by the flow path forming body 441 of the flow path forming body 12 through the insulating member 752.

In this case, a thickness of the relay bus bar 753 is formed to be greater than a thickness of the AC terminal 320B and thereby it is possible to actively radiate the heat from the AC connector 188. Thus, improvement of durability including the heat resistance of the power semiconductor modules 300*a* to 300*c* and 301*a* to 301*c* is expected. However, if the thicknesses of the bus bars which are weld-connected are remarkably different, there is a concern that durability including strength is deteriorated or weldability is deteriorated due to the vibration or the impact after the weld connection. Thus, in the embodiments, a difference in the thicknesses of the bus bars which are weld-connected together is suppressed to 30% or less. However, this is not only the case where the concern is resolved.

REFERENCE SIGNS LIST

8: lid
11: base plate
11*a* and 11*b*: through hole
12: flow path forming body
12*a* to 12*d*: side wall
13: inlet pipe
14: outlet pipe
19*a*: first flow path section
19*b*: second flow path section
19*c*: third flow path section
19*d*: fourth flow path section
19*e*: fifth flow path section
19*f*: sixth flow path section
19*g*: seventh flow path section
19*h*: eighth flow path section
19*i*: ninth flow path section
20: control circuit substrate
21: connector
22: driver circuit substrate
22*a* to 22*f*: through hole
23*a*: connection section
23*b*: connection section
24: transformer
138: DC connector
156, 166: diode
200: power converter
202: first opening
203: second opening
204*a*: third opening
204*b*: fourth opening
205: fifth opening
300*a* to 300*c*, 301*a* to 301*c*: power semiconductor module
302: module primary sealing body
304: module case
304A: thin section
304B: flange
305: fin
306: inserting port
307A: first heat radiation surface
307B: second heat radiation surface
309: screw
315: conductive plate
315A: DC positive electrode wiling
315B: DC positive electrode terminal
315C: auxiliary module-side DC positive electrode connection terminal
315D: device-side DC positive electrode connection terminal
318, 319, 320: conductive plate
319A: DC negative electrode wiring
319B: DC negative electrode terminal
319C: auxiliary module-side DC negative electrode connection terminal
319D: device-side DC negative electrode connection terminal
320A: AC wiring
320B: AC terminal
320C: auxiliary module-side AC connection terminal
320D: device-side AC connection terminal
322: device fixing section
324U, 324L: signal wiring
325L, 325U: signal terminal
326L, 326U: auxiliary module-side signal connection terminal
327L, 327U: device-side signal connection terminal
328, 330: IGBT
328A, 330A: control electrode
329: intermediate electrode
333: insulating member
348: first sealing resin
350: auxiliary machine power module
351: second sealing resin
360: height of power semiconductor module
370: connection section
371: bonding wire
372: tie bar
400*a* to 400*c*: opening section
402*a* to 402*c*: opening section.
404: opening section
405: housing space
406*a* to 406*f*: convex section
409: sealing member
417: flow direction
420: lower cover
441: first flow path forming body 442: second flow path forming body
444: third flow path forming body
500: capacitor module
501: laminated conductive plate
502: capacitor case
503a to 503f: capacitor terminal
505: negative electrode conductive plate
507: positive electrode conductive plate
508: negative electrode-side power supply terminal
509: positive electrode-side power supply terminal
510: negative electrode-side power line
511: housing section
512: positive electrode-side power line
514: capacitor cell
515a, 515b: noise filter capacitor cell
516, 517: auxiliary capacitor terminal
520a to 520h: hole
530: relay conductive section
540: height of capacitor module
550: insulating sheet
551: filling material
600: auxiliary mold body
608: wiring insulating section
750: AC relay bus bar
751: AC relay bus bar
750a to 750c: AC welding connection section
751a to 751c: AC welding connection section
752: insulating member
753: relay bus bar
755: through hole
760, 761: AC terminal block
762: resin block
763: AC bus bar

The invention claimed is:

1. A power converter comprising:
a power semiconductor module that converts DC current into AC current;
a casing that forms a housing space for housing the power semiconductor module;
an AC relay bus bar that is connected to an AC terminal of the power semiconductor module by weld connection; and
an AC terminal block that is connected to an AC terminal of a motor,
wherein the AC relay bus bar is supported by the casing through an insulating member,
wherein the AC terminal block is connected to the AC relay bus bar and supported by the casing,
wherein the AC relay bus bar forms a first through hole, and
wherein the AC terminal block is connected to the AC relay bus bar by a first fastening member passing through the first through hole.

2. The power converter according to claim 1,
wherein the AC terminal block includes an AC bus bar that is connected to the AC relay bus bar by mechanical connection and a resin block,
wherein the AC relay bus bar is configured of a metal material different from that of the AC bus bar, and
wherein a volume of the AC relay bus bar is smaller than a volume of the AC bus bar.

3. The power converter according to claim 2,
wherein a thickness of the AC relay bus bar is formed to be greater than a thickness of the AC terminal of the power semiconductor module.

4. The power converter according to claim 1,
wherein the first through hole is an elliptical shape of which a long diameter is formed in a direction of arrangement of the AC terminal block and the AC relay bus bar.

5. The power converter according to claim 4, further comprising:
a driver circuit substrate that outputs a driving signal transmitted to the power semiconductor module; and
a current sensor that forms the first through hole to detect the AC current,
wherein the driver circuit substrate is disposed between the AC terminal block and the AC relay bus bar,
wherein the driver circuit substrate forms a third through hole,
wherein the current sensor is disposed such that the second through hole of the current sensor faces the third through hole, and
wherein the AC bus bar is connected to the AC relay bus bar through the second through hole and the third through hole.

6. The power converter according to claim 5, further comprising:
a base plate that supports the driver circuit substrate,
wherein the base plate is supported by the casing, and
wherein the AC terminal block is supported by the base plate.

* * * * *